(12) United States Patent
Usujima et al.

(10) Patent No.: US 8,216,895 B2
(45) Date of Patent: Jul. 10, 2012

(54) SEMICONDUCTOR DEVICE AND METHOD OF MANUFACTURING THE SAME

(75) Inventors: Akihiro Usujima, Yokohama (JP); Shigeo Satoh, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 122 days.

(21) Appl. No.: 12/833,279

(22) Filed: Jul. 9, 2010

(65) Prior Publication Data
US 2011/0018067 A1 Jan. 27, 2011

(30) Foreign Application Priority Data
Jul. 22, 2009 (JP) .................................. 2009-171624

(51) Int. Cl.
*H01L 21/8238* (2006.01)
(52) U.S. Cl. ........ 438/217; 438/199; 438/218; 438/221; 438/202; 257/369; 257/E21.632
(58) Field of Classification Search .................. 438/217, 438/218, 221, 199, 202; 257/369, E21.632, 257/E27.062
See application file for complete search history.

(56) References Cited

U.S. PATENT DOCUMENTS
5,726,476 A * 3/1998 Kim .............................. 257/369
6,384,455 B1 5/2002 Nishigohri

FOREIGN PATENT DOCUMENTS
JP 11-111639 A 4/1999

* cited by examiner

*Primary Examiner* — Thinh T Nguyen
(74) *Attorney, Agent, or Firm* — Westerman, Hattori, Daniels & Adrian, LLP

(57) ABSTRACT

A method of manufacturing a semiconductor device includes forming a first and a second isolation insulating film to define a first, a second, a third and a fourth region, forming a first insulating film, implanting a first impurity of a first conductivity type through the first insulating film into the first, the second and the fourth region at a first depth, forming a second insulating film thinner than the first insulating film, implanting a second impurity of a second conductivity type through the second insulating film into the third region at a second depth in the semiconductor substrate, implanting a third impurity of the second conductivity type into the third region at a third depth shallower than the second depth, forming a first transistor of the first conductivity type in the third region, and forming a second transistor of the second conductivity type in the fourth region.

14 Claims, 34 Drawing Sheets

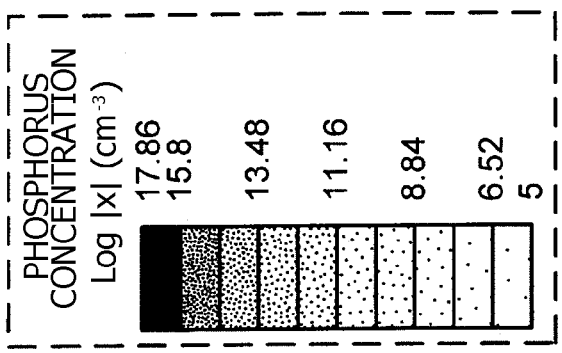
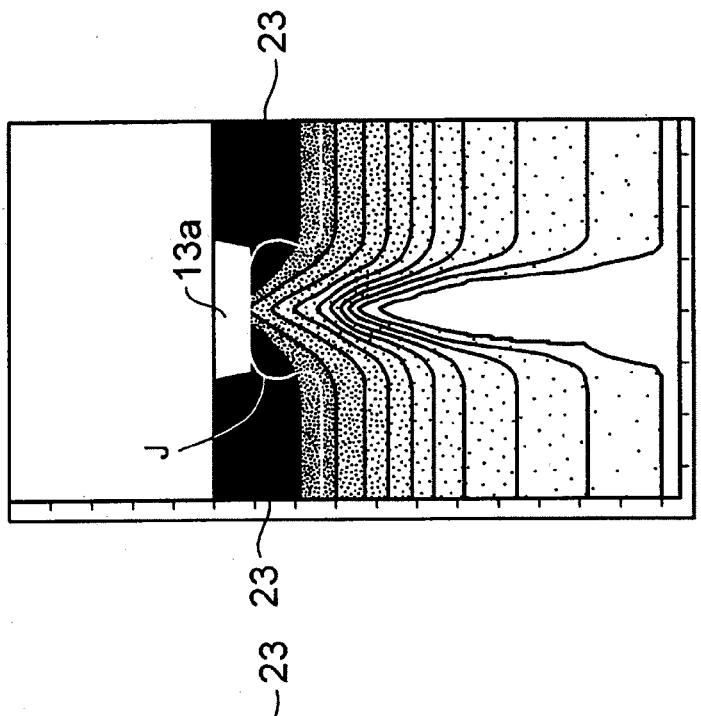
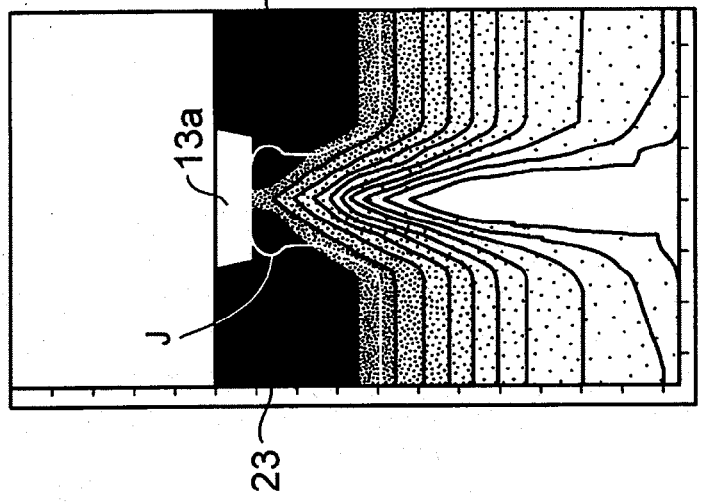

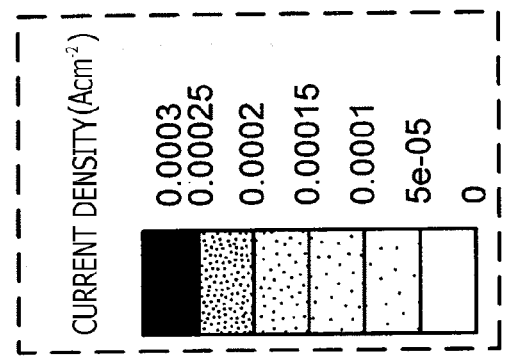
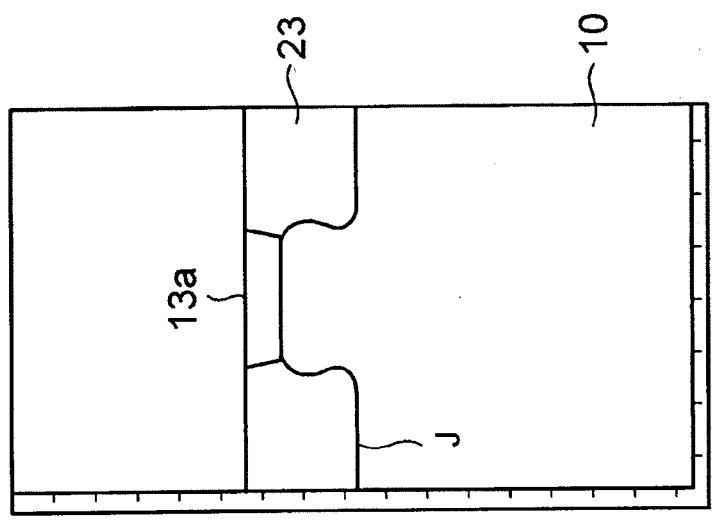
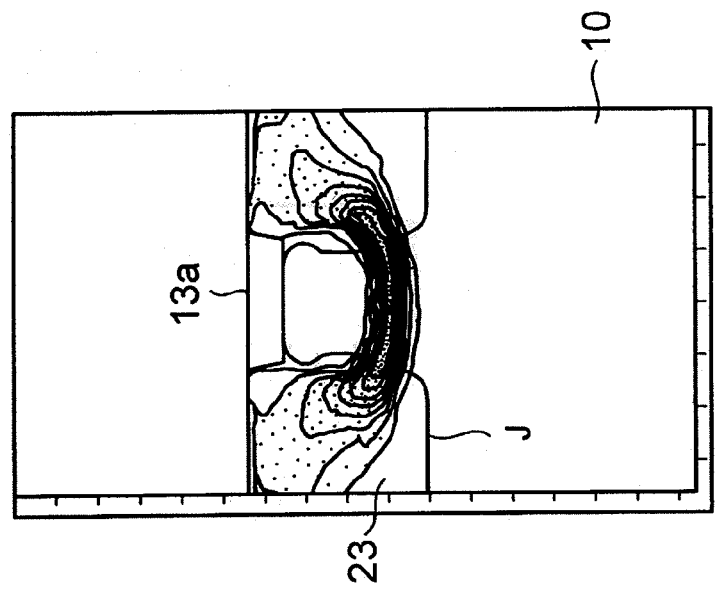

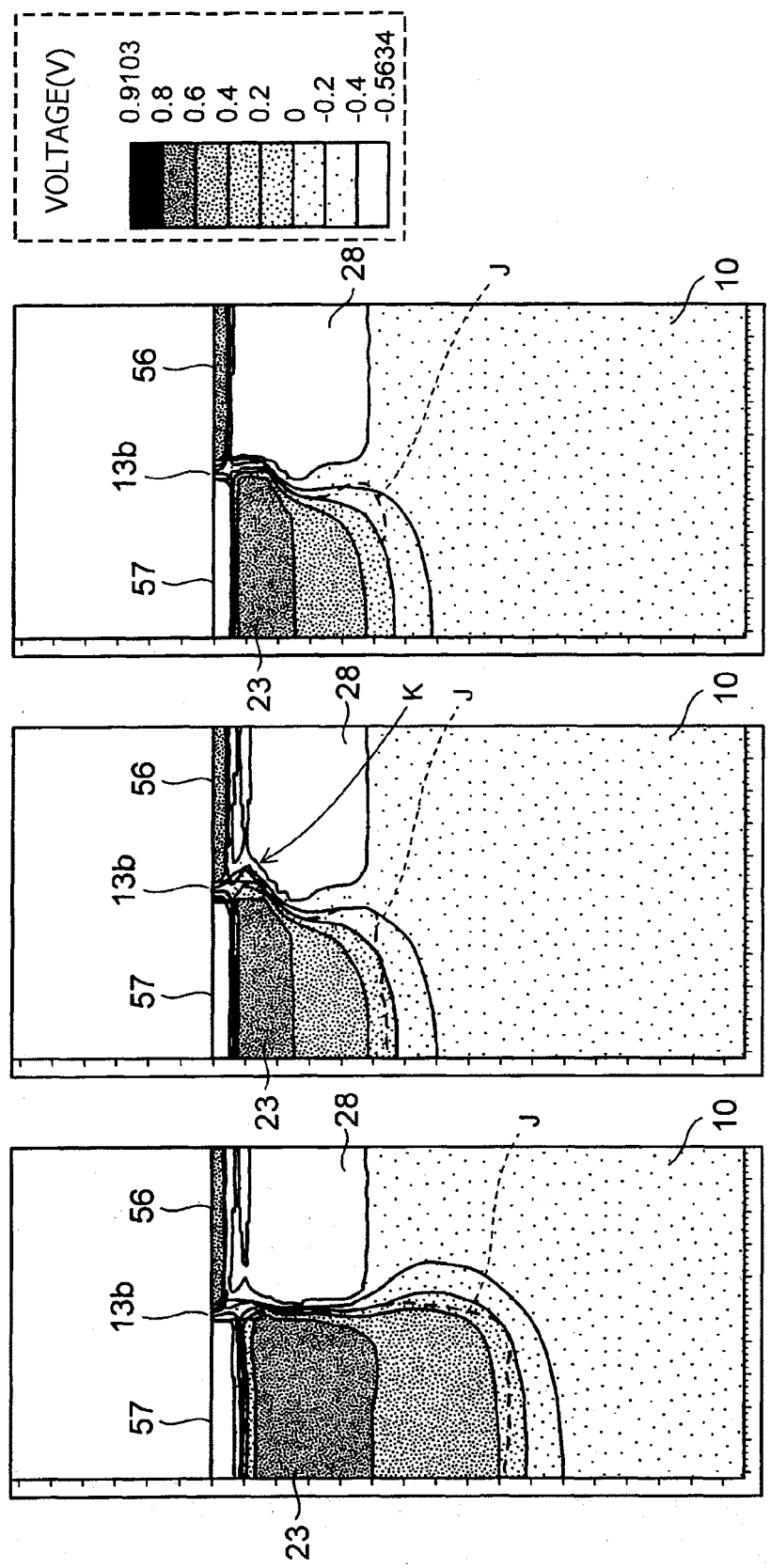

SEMICONDUCTOR DEVICE AND METHOD OF MANUFACTURING THE SAME

CROSS REFERENCE TO RELATED APPLICATIONS

This application is based upon and claims the benefit of priority from the prior Japanese Patent Application No. 2009-171624, filed on Jul. 22, 2009, the entire contents of which is incorporated herein by reference.

FIELD

The present invention relates to a semiconductor device and a method of manufacturing the same.

BACKGROUND

In semiconductor devices, such as LSIs, various isolation techniques are used to electrically isolate elements disposed on semiconductor substrates. As the isolation method, for example, a method is used in which, using the p-n junction between p-well and n-well, an element in the p-well and an element in the n-well are isolated from each other. There is also a technique in which isolation is performed by forming a trench in a semiconductor substrate, such as shallow trench isolation (STI).

If isolation is insufficient, there is a possibility that the isolation breakdown voltage between adjacent elements may become low, resulting in occurrence of punch-through between the elements. The punch-through may cause leakage current and hinder reduction in power consumption and the like in semiconductor devices. Furthermore, as the distance between elements decreases with miniaturization of semiconductor devices, punch-through more easily occurs.

Accordingly, it is desirable to provide an isolation structure in which isolation breakdown voltage between elements may be sufficiently secured even if semiconductor devices become miniaturized. A technique regarding an isolation structure is described in Japanese Laid-Open Patent Publication No. 11-111639.

SUMMARY

According to an aspect of the invention, a method of manufacturing a semiconductor device includes forming a first and a second isolation insulating film to define a first, a second, a third and a fourth region, forming a first insulating film, implanting a first impurity of a first conductivity type through the first insulating film into the first, the second and the fourth region at a first depth, forming a second insulating film thinner than the first insulating film, implanting a second impurity of a second conductivity type through the second insulating film into the third region at a second depth in the semiconductor substrate, implanting a third impurity of the second conductivity type into the third region at a third depth shallower than the second depth, forming a first transistor of the first conductivity type in the third region, and forming a second transistor of the second conductivity type in the fourth region.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 22A, 22B, and 22C are views illustrating the phosphorus concentration distribution in the vicinity of the first isolation insulating film according to the first embodiment;
FIGS. 23A, 23B, and 23C are views illustrating the current density of the semiconductor device according to the first embodiment;
FIGS. 27A, 27B, 27C and 27D are views illustrating potential profiles in silicon substrates.

DESCRIPTION OF EMBODIMENTS

In a semiconductor device, such as an LSI, p-wells and n-wells are formed so that various potential regions are formed in a semiconductor substrate, and the wells are electrically isolated from each other by p-n junctions, STI, or the like.

Figure 1:
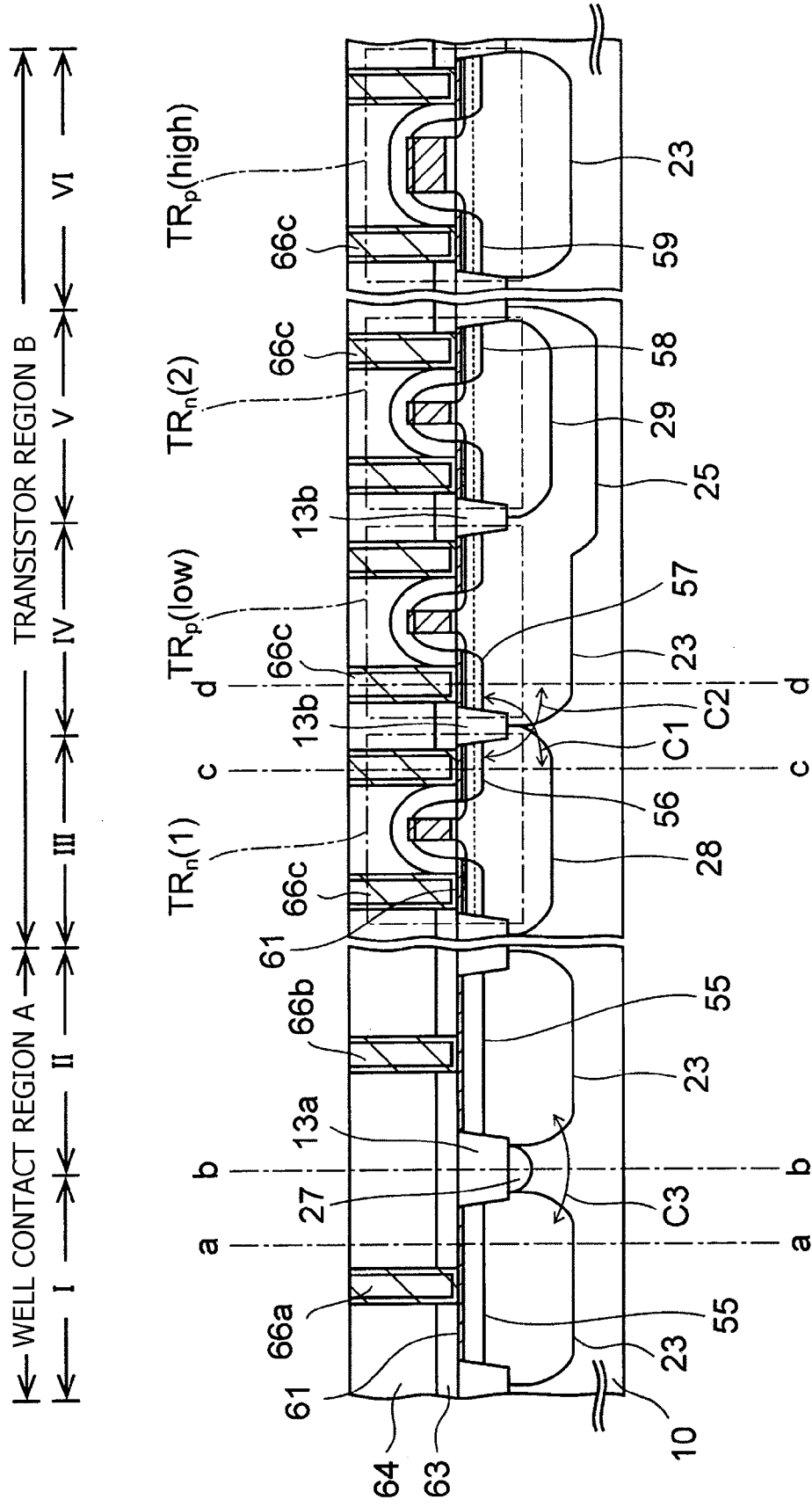
FIG. 1 is a cross-sectional view of a semiconductor device.

FIG. 1 is a cross-sectional view illustrating an example of an arrangement of wells and STI.

A semiconductor device illustrated in FIG. 1 includes a p-type silicon substrate 10 having a well contact region A and a transistor region B.

In the well contact region A, the silicon substrate 10 is divided into a first region I and a second region II by a first isolation insulating film 13a for STI.

Two first n-wells 23 are formed in the regions I and II of the silicon substrate 10, the first n-wells 23 being formed by the same ion implantation step. A first p-well 27 is formed under the first isolation insulating film 13a, and the two n-wells 23 were electrically isolated from each other by the p-n junction at the interface between the first p-well 27 and each of the n-wells 23.

Furthermore, n-type impurity regions 55 are formed as surface layers of the two n-wells 23 in order to reduce the contact resistance between each of conductive plugs 66a and 66b, which will be described below, and the corresponding first n-well 23.

In the transistor region B, the silicon substrate 10 is divided into a third region III, a fourth region IV, a fifth region V, and a sixth region VI by a second isolation insulating film 13b for STI.

A second p-well 28 and a first n-type MOS transistor TR$_n$(1) having first n-type source/drain regions 56 are formed in the third region III of the silicon substrate 10.

In the fourth region IV of the silicon substrate 10, a first n-well 23, which is formed by the same step as that for the n-wells 23 in the well contact region A, is formed, and also a low-voltage p-type MOS transistor TR$_p$(low) having first p-type source/drain regions 57 is formed.

The first n-well 23 in the fourth region IV and the second p-well 28 in the third region III are electrically isolated from each other by the p-n junction therebetween and the second isolation insulating film 13b.

In the fifth region V of the silicon substrate 10, a second n-well 25, which is deeper than the first n-well 23, is formed so as to be connected to the first n-well 23. The second n-well 25 may also be referred to as the "deep n-well".

A third p-well 29, which is formed by the same ion implantation step as that for the second p-well 28, is formed in the silicon substrate 10 at the portion shallower than the second n-well 25. By enclosing the third p-well 29 with the second n-well 25, the third p-well 29 may be electrically isolated from its surrounding. Thus, it is possible to apply a potential that is different from that of the second p-well 28 to the third p-well 29.

Second n-type source/drain regions 58 of a second n-type MOS transistor TR$_n$(2) are formed as surface layers of the third p-well 29.

In the sixth region VI of the silicon substrate 10, a first n-well 23 is formed by the same ion implantation step as that for the n-wells 23 in the well contact region A and the fourth region IV. A high-voltage p-type MOS transistor TR$_p$(high), which has a higher operating voltage than the low-voltage p-type MOS transistor TR$_p$(low) in the fourth region IV, and second p-type source/drain regions 59 of the transistor TR$_p$(high) are formed in the first n-well 23.

A high-melting-point metal silicide layer 61, such as a cobalt silicide layer, is formed as a surface layer of the silicon substrate 10 in the regions A and B. The resistance of each of the source/drain regions 56 to 59 and the n-type impurity regions 55 is reduced by the high-melting-point metal silicide layer 61.

A cover insulating film 63 and an interlayer insulating film 64 are formed in that order over the entire upper surface of the silicon substrate 10. The cover insulating film 63 is, for example, a silicon nitride film, and the interlayer insulating film 64 is, for example, a silicon oxide film.

Contact holes are formed by patterning in the insulating films 63 and 64, and a first conductive plug 66a, a second conductive plug 66a, and third conductive plugs 66c composed of tungsten or the like are formed in the contact holes.

In such a semiconductor device, the first n-type MOS transistor TR$_p$(1) and the low-voltage p-type MOS TRANSISTOR TR$_p$(low) are electrically isolated from each other by the second isolation insulating film 13b therebetween and the p-n junction between the wells 28 and 23.

As semiconductor devices become miniaturized and the width of the second isolation insulating film 13b decreases, isolation by the isolation insulating film 13b becomes insufficient.

As a result, there is a possibility that punch-through may occur along the path C1 between the second p-well 28 and the first p-type source/drain region 57 and punch-through may occur along the path C2 between the first n-well 23 and the first n-type source/drain region 56.

In order to prevent the punch-through by sufficiently performing isolation in the second isolation insulating film 13b, it is effective to increase the impurity concentration of the second p-well 28 at the side of the second isolation insulating film 13b to increase the potential barrier between the wells 23 and 28 due to the p-n junction.

In order to increase the impurity concentration of the second p-well 28, for example, a method may be used in which the second p-well 28 is shallowly formed by decreasing the acceleration energy without changing the dose during the well formation. When this method is used, the third p-well 29, which is formed at the same time with the second p-well 28, is also shallowly formed.

However, when the third p-well 29 is shallowly formed, cross-sectional area of the well is reduced, resulting in an increase in the well resistance.

With respect to the well contact region A, as described above, the two first n-wells 23 are electrically isolated by the first p-well 27.

The first p-well 27 is formed by the same ion implantation step as that for the second p-well 28 and the third p-well 29 in the transistor region B.

However, since the first p-well 27 is formed under the first isolation insulating film 13a composed of amorphous silicon oxide, the directivity of ion-implanted impurity is disturbed by the first isolation insulating film 13a. Therefore, under the first isolation insulating film 13a, a phenomenon referred to as channeling in which the impurity reaches an unintended depth because of the crystallinity of the silicon substrate 10 is suppressed. Consequently, the first p-well 27 is formed shallower than the second p-well 28 and the third p-well 29.

When the first p-well 27 is shallowly formed as described above, the height of the potential barrier due to the p-n junction between each of the wells 23 and the well 27 increases in the deep portion of the silicon substrate 10. As a result, punch-through easily occurs along the path C3 between the first n-wells 23.

There is a possibility that punch-through may occur markedly when the width of the first isolation insulating film 13a decreases with miniaturization of semiconductor devices.

In view of the findings described above, the inventor of the present application has conceived the embodiments described below.

FIGS. 2 to 18 are cross-sectional views illustrating steps of a method for manufacturing a semiconductor device according to a first embodiment. The same reference numerals are used for the same components as those of the semiconductor device described with reference to FIG. 1.

The semiconductor device according to the first embodiment has a well contact region A and a transistor region B.

Figure 2:
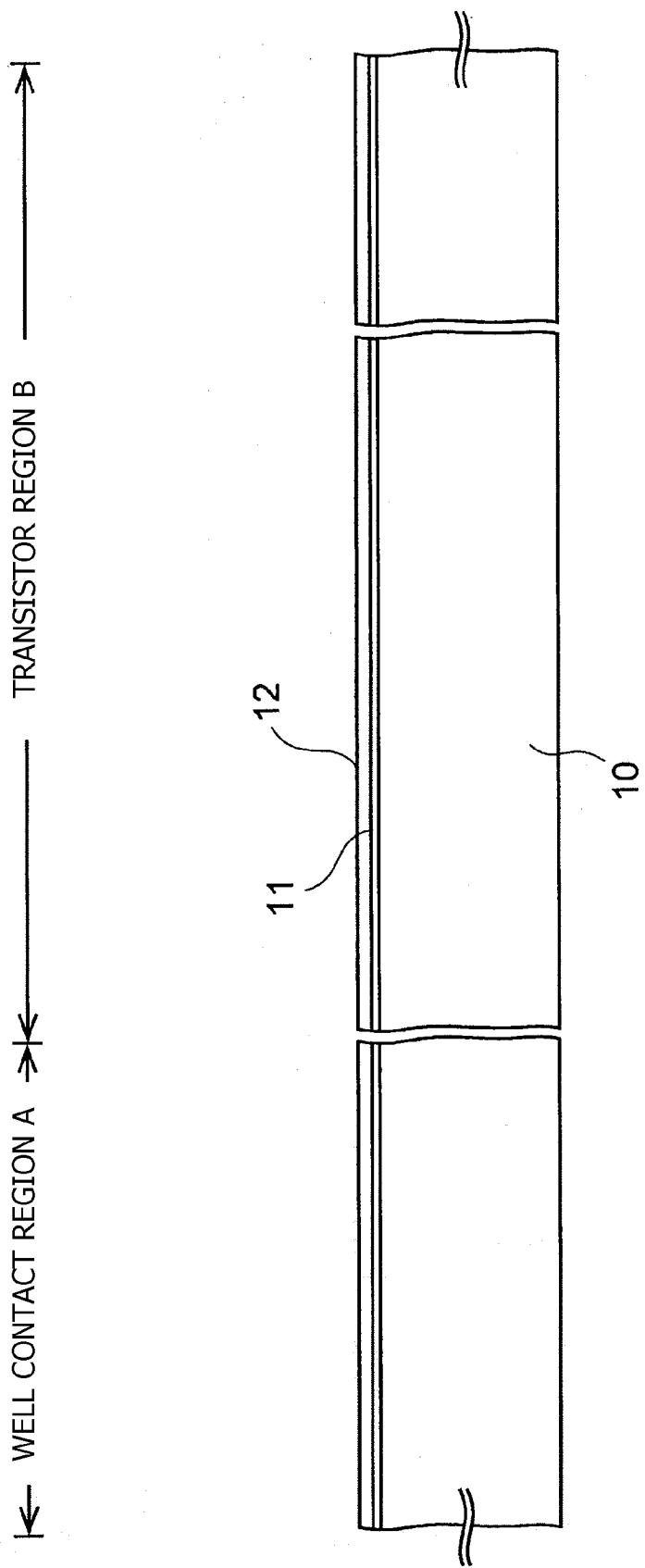
FIGS. 2 to 18 are cross-sectional views illustrating a method of manufacturing a semiconductor device according to a first embodiment.

As illustrated in FIG. 2, the surface of a p-type silicon substrate 10 with a resistivity of 10 Ωcm is subjected to thermal oxidation to form a thermal oxide film 11 with a thickness of about 10 nm. For example, a silicon nitride film 12 with a thickness of about 90 nm is formed by chemical vapor deposition (CVD) on the thermal oxide film 11.

Figure 3:
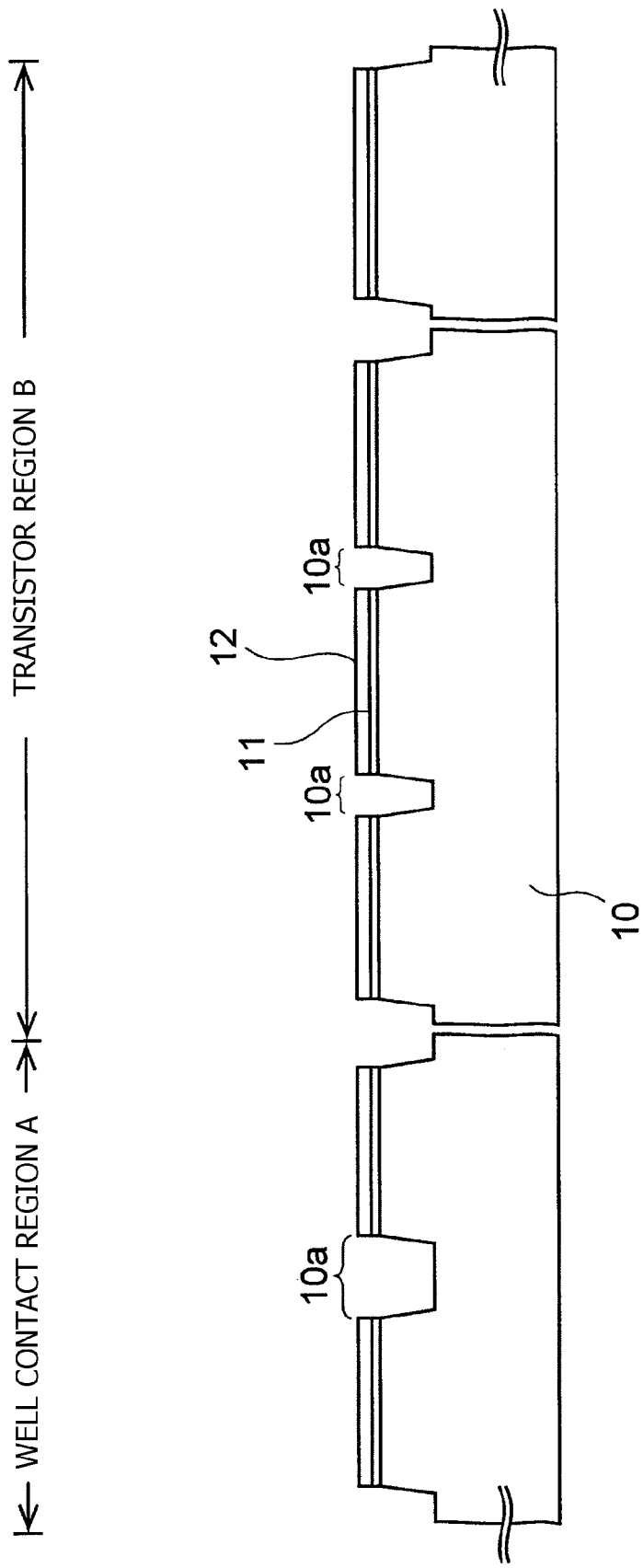

As illustrated in FIG. 3, the silicon substrate 10, the thermal oxide film 11, and the silicon nitride film 12 are subjected to patterning using photolithography and dry etching to form isolation trenches 10a for STI in the silicon substrate 10. In the dry etching, the silicon nitride film 12 serves as a hard mask.

The depth of the isolation trenches 10a is not particularly limited. In this embodiment, the isolation trenches 10a are formed at a depth of 260 to 350 nm and, for example, at a depth of 330 nm.

Figure 4:
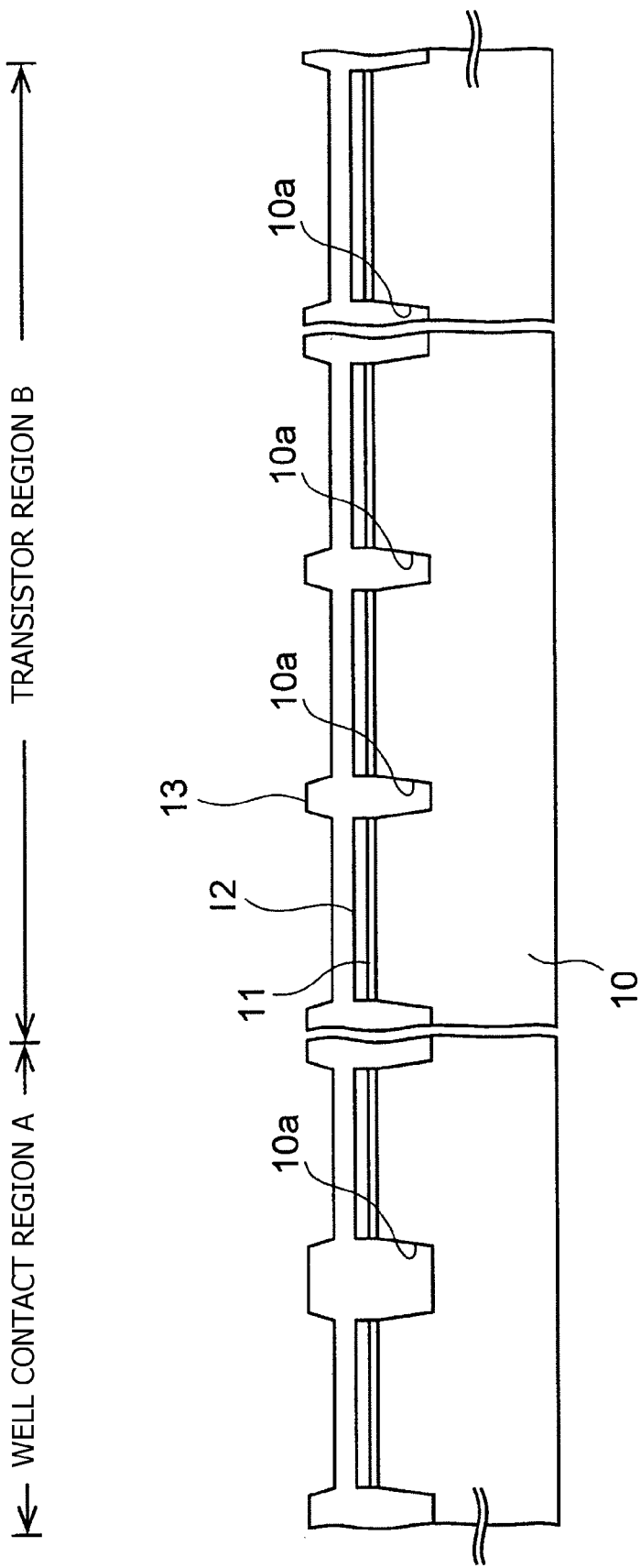

As illustrated in FIG. 4, a silicon oxide film is formed as an embedding insulating film 13 by CVD inside the isolation trenches 10a and over the silicon nitride film 12, and the isolation trenches 10a are embedded with the embedding insulating film 13.

Figure 5:
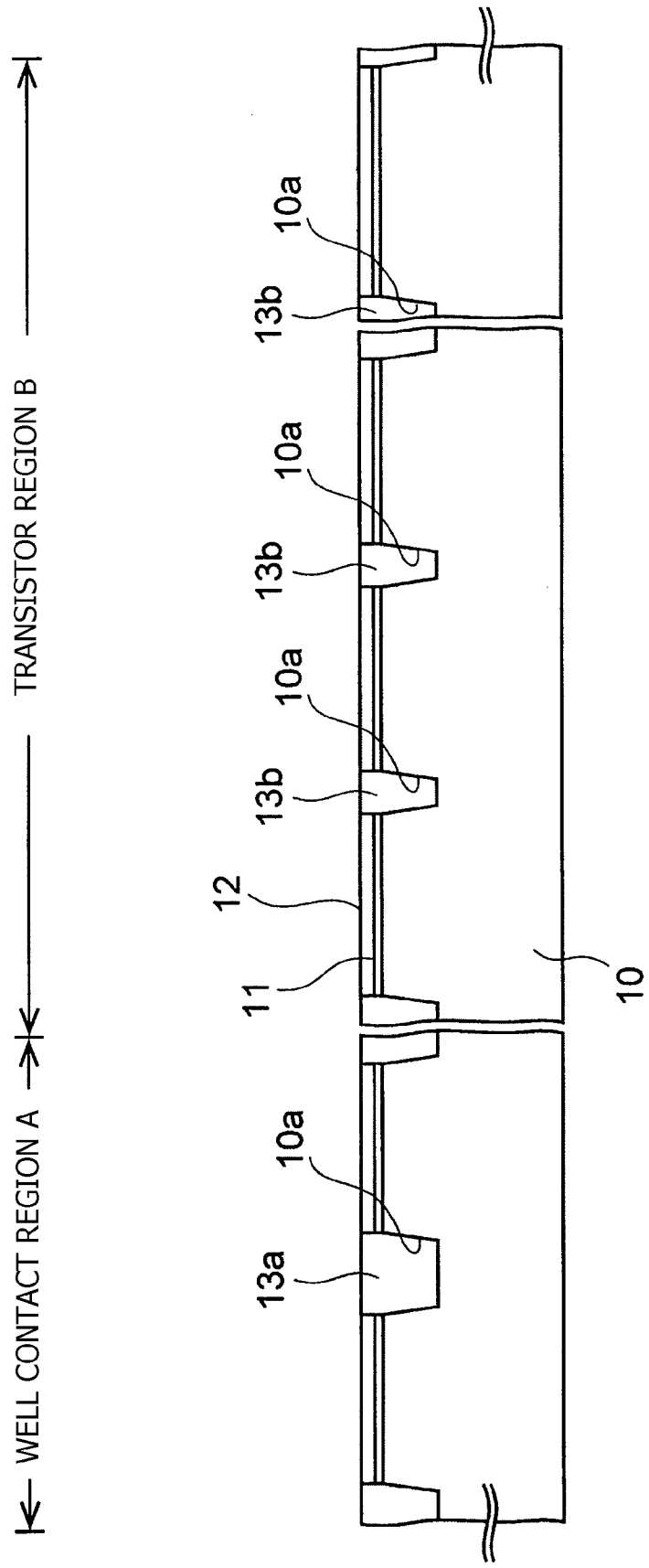

As illustrated in FIG. 5, the excess embedding insulating film 13 on the silicon nitride film 12 is removed by polishing by chemical mechanical polishing (CMP). Thereby, the embedding insulating film 13 remains as a first isolation insulating film 13a or a second isolation insulating film 13b in the isolation trenches 10a in the well contact region A and the transistor region B.

Figure 6:
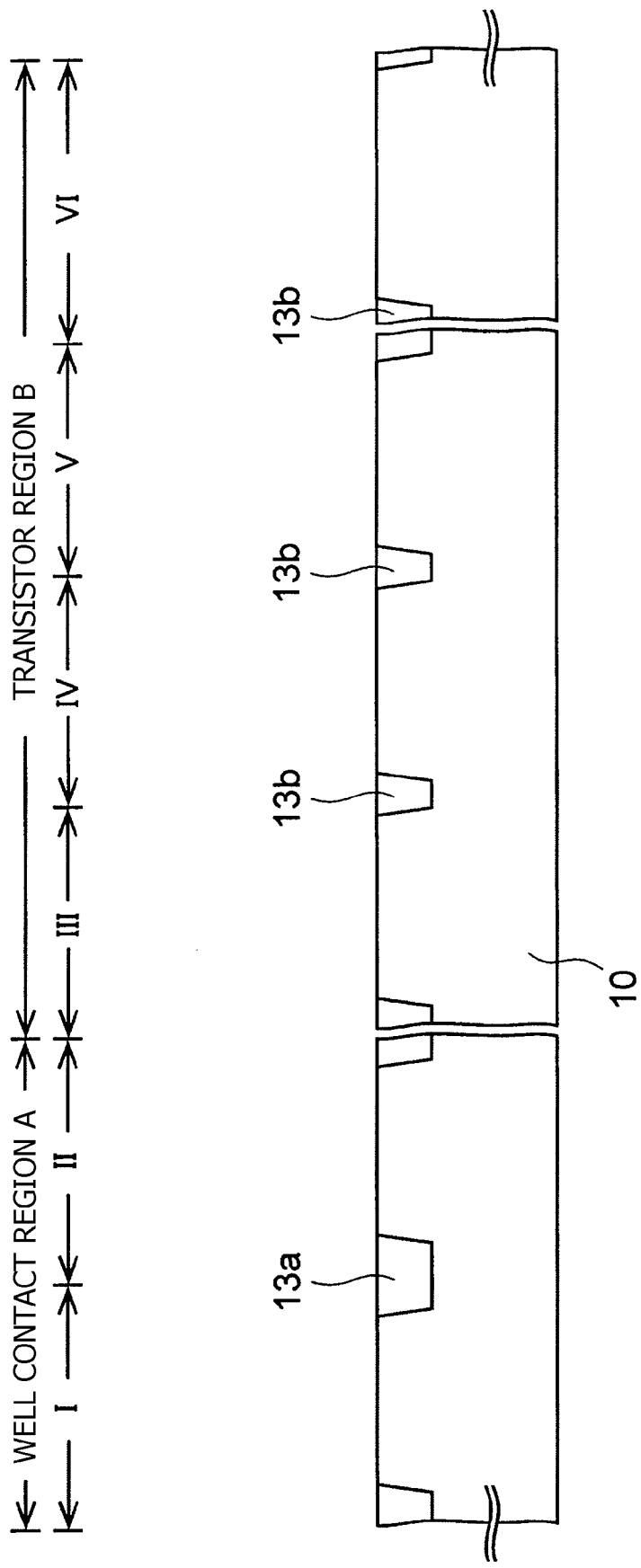

As illustrated in FIG. 6, the thermal oxide film 11 and the silicon nitride film 12 are removed by dry etching to expose the clean surface of the silicon substrate 10.

By carrying out the steps described above, the well contact region A of the silicon substrate 10 is divided into a first region I and a second region II by the first isolation insulating film 13a. The transistor region B of the silicon substrate 10 is divided into a third region III, a fourth region IV, a fifth region V, and a sixth region VI by the second isolation insulating film 13b.

A process for obtaining the cross-sectional structure illustrated in FIG. 7 will be described below.

By subjecting the surface of the silicon substrate 10 to thermal oxidation, a thermal oxide film is formed as a first insulating film 21 with a first thickness T1. The first thickness T1 is not particularly limited. In this embodiment, the first thickness T1 is set at 120 to 360 nm and, for example, 210 nm.

A photoresist is applied onto the first insulating film 21, and by exposing and developing the photoresist, a first resist pattern 22 is formed.

Using the first resist pattern 22 as a mask and using the first insulating film 21 as a through film, phosphorus is ion-implanted as an n-type impurity into the silicon substrate 10.

Thereby, first n-wells 23 are formed at a first depth D1 in the well contact region A of the silicon substrate 10 and in the fourth and sixth regions IV and VI of the transistor region B. The conditions for the ion implantation are not particularly limited. For example, the acceleration energy is set at 360±30 keV, the dose is set at $3\times10^{13}$ $cm^{-2}$±10%, and the tilt angle is set at 0°.

In this embodiment, the ion implantation is performed at an acceleration energy of 360 keV and a dose of $3\times10^{13}$ $cm^{-2}$. In such a case, the peak depth at which the phosphorus concentration is maximum in the silicon substrate 10 is 0.23 µm, and the peak concentration of phosphorus at the depth is $1\times10^{18}$ $cm^{-3}$.

Among the first n-wells 23 formed as described above, the first n-wells 23 formed in the first region I and in the fourth region IV are linked together, and these regions are electrically connected to each other by phosphorus in the first n-wells 23.

The first n-wells 23 formed in the second region II and the sixth region VI are also linked together, and these regions are electrically connected to each other.

The first resist pattern 22 is removed.

A process for obtaining the cross-sectional structure illustrated in FIG. 8 will be described below.

The first insulating film 21 used as the through film in the formation of the first n-wells 23 is removed by wet etching using a hydrofluoric acid solution.

The silicon substrate 10 is subjected to thermal oxidation again to form a thermal oxide film having a second thickness T2 that is smaller than the first thickness T1 of the first insulating film 21 (refer to FIG. 7), and the thermal oxide film is used as a second insulating film 30. The second thickness T2 is not particularly limited. In this embodiment, the second thickness T2 is set at 10 nm.

A photoresist is applied onto the second insulating film 30, and by exposing and developing the photoresist, a second resist pattern 31 is formed. As illustrated in the drawing, the second resist pattern 31 has windows 31a on the first isolation insulating film 13a in the well contact region A and on the third region III and the fifth region V.

Using the second resist pattern 31 as a mask layer, boron is ion-implanted as a p-type impurity into the silicon substrate 10.

In the ion implantation, the second insulating film 30 is used as a through film, and a first p-well 27 is formed under the first isolation insulating film 13a in the well contact region A.

In the transistor region B, a second p-well 28 and a third p-well 29 are formed at substantially the same depth in the third region III and the fifth region V, respectively.

The conditions for the ion implantation are not particularly limited. For example, the acceleration energy is set at 150±30 keV, the dose is set at $3\times10^{13}$ $cm^{-2}$±10%, and the tilt angle is set at 0°.

In this embodiment, the ion implantation is performed at an acceleration energy of 150 keV and a dose of $3\times10^{13}$ $cm^{-2}$.

In the ion implantation, the directivity of ion-implanted impurity is disturbed by the first isolation insulating film 13a and the second insulating film 30 composed of amorphous silicon oxide, and channeling of the impurity is suppressed. In particular, the first p-well 27 is formed by the impurity in which channeling is effectively suppressed by both the first isolation insulating film 13a and the second insulating film 30, and thus, has a shallower depth than the second p-well 28 and the third p-well 29.

Figure 7:
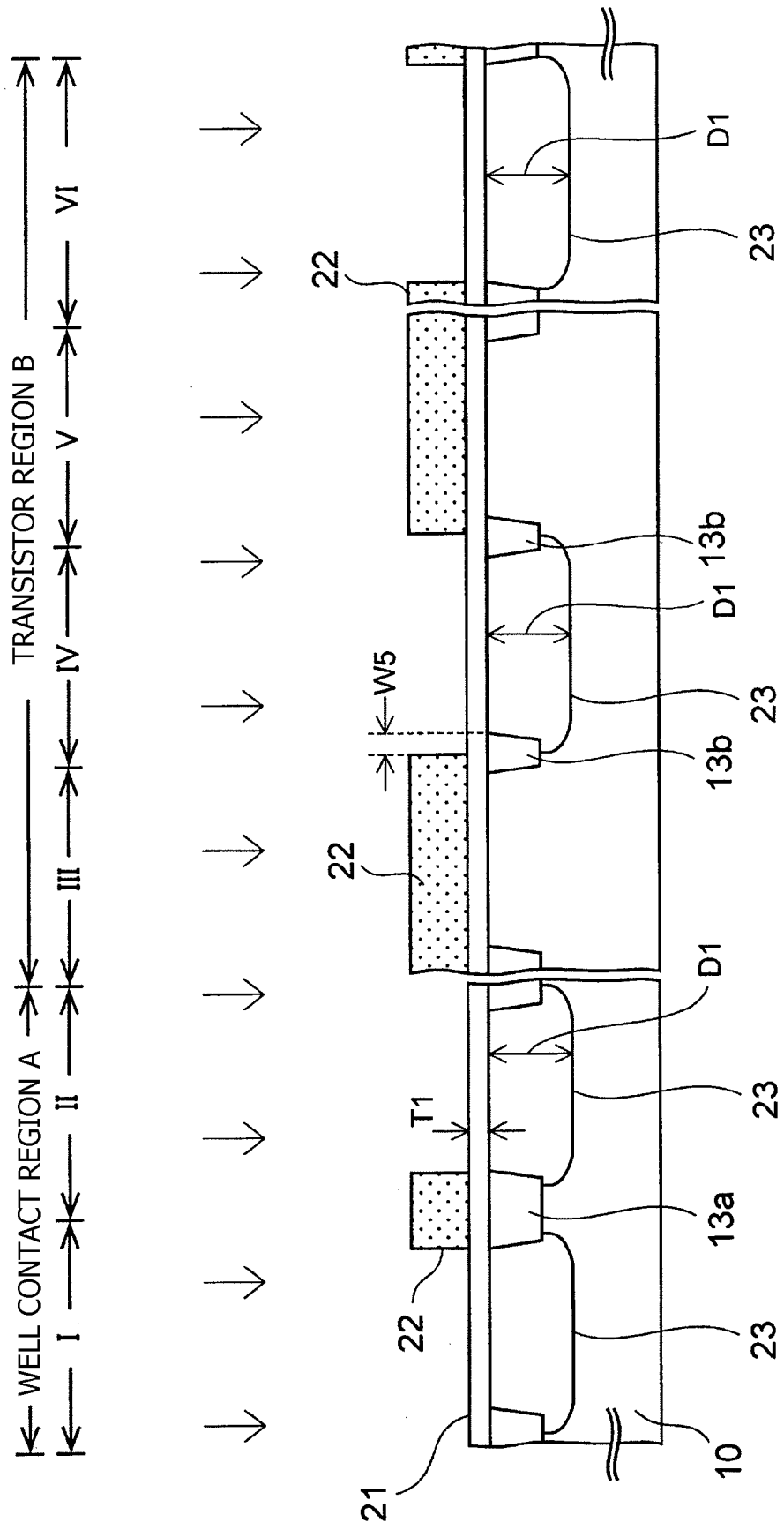

Furthermore, in the second p-well 28 and the p-well 29, since the thickness of the second insulating film 30 is set smaller than the thickness of the first insulating film 21, the channeling effect is markedly exhibited compared with the first n-wells 23 which are formed using the first insulating film 21 as a through film, and the second p-well 28 and the third p-well 29 are formed at a second depth D2 which is larger than the first depth D1 illustrated in FIG. 7.

By forming the second p-well 28 and the third p-well 29 deeply in such a manner, it is possible to prevent the cross-sectional areas of the wells from being decreased because of decreased depth, and the resistance of the second p-well 28 and the third p-well 29 may be maintained to be low.

Figure 9:
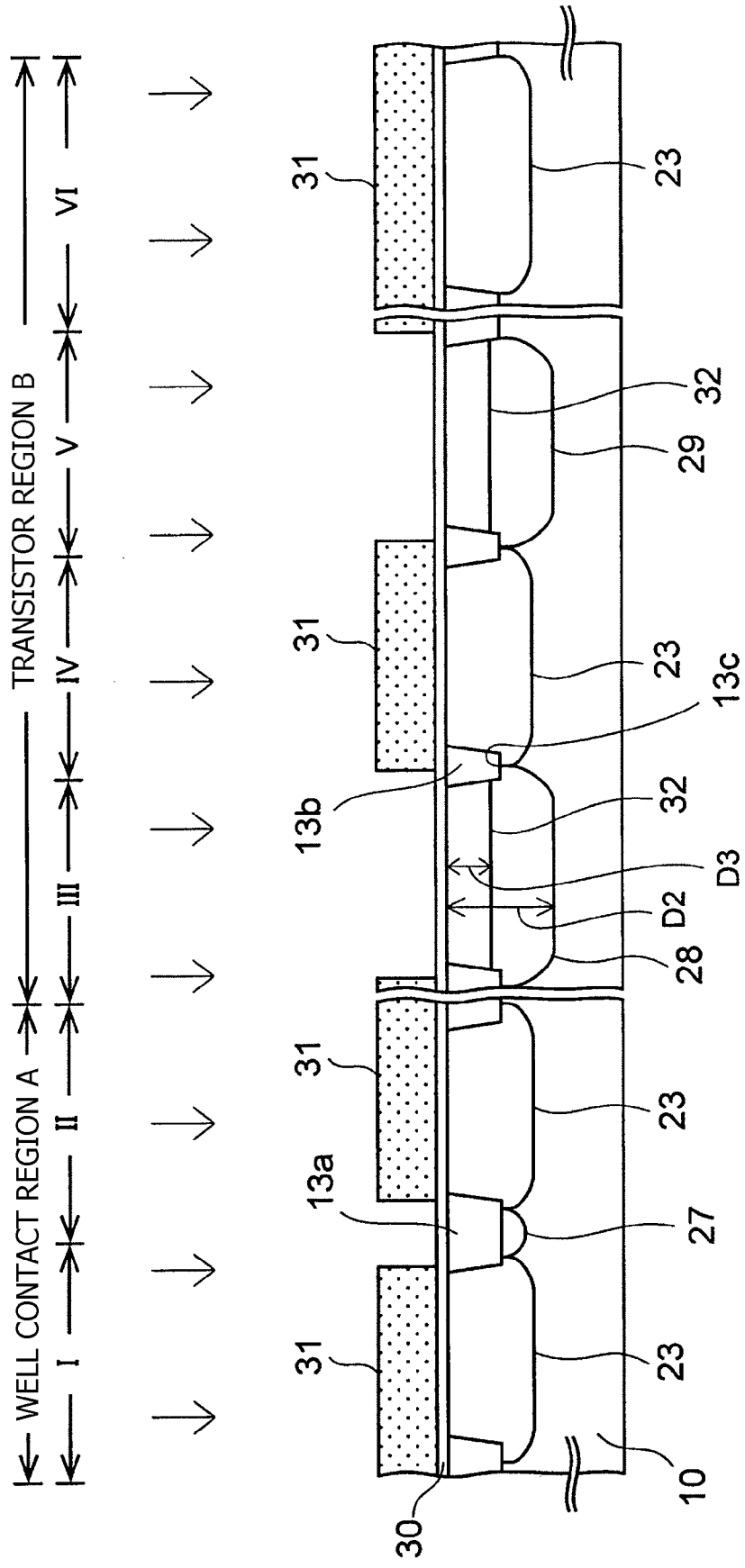

As illustrated in FIG. 9, while continuously using the second resist pattern 31 as a mask, additional ion implantation of the p-type impurity is performed through the second insulating film 30 into the third region III and the fifth region V.

Thereby, a fourth p-well 32 is formed in each of the regions III and V of the silicon substrate 10 at a third depth D3 which is smaller than the second depth D2.

The conditions for the ion implantation are not particularly limited. For example, boron is ion-implanted at an acceleration energy of 60±20 keV, a dose of $1\times10^{13}$ $cm^{-2}$±10%, and a tilt angle of 0°.

In this embodiment, the ion implantation is performed at an acceleration energy of 60 keV and a dose of $1\times10^{13}$ $cm^{-2}$.

At the completion of this step, the peak concentration of boron in the second p-well 28 is $8 \times 10^{17}$ cm$^{-3}$, and the peak depth is about 0.47 µm. The peak depth is larger than 330 nm which is the depth of the bottom 13c of the second isolation insulating film 13b. Therefore, the potential barrier due to the p-n junction between the first n-well 23 and the second p-well 28 on the lower side of the bottom 13c increases, and isolation may be performed satisfactorily on the lower side of the bottom 13c.

In the fourth p-well 32 formed by the additional ion implantation, the peak concentration of boron is $5 \times 10^{17}$ cm$^{-3}$, and the peak depth is about 0.21 µm. The depth is smaller than the depth of the bottom 13c of the second isolation insulating film 13b, and thus, the concentration peak of the fourth p-well 32 is located at the side of the second isolation insulating film 13b. Consequently, the boron concentration at the side of the second insulating film 13b is increased compared with the case where additional ion implantation is not performed, and isolation may be performed by the second isolation insulating film 13b.

In the first p-well 27 under the first isolation insulating film 13a, the peak concentration of boron is $1.5 \times 10^{18}$ cm$^{-3}$, and the peak depth is about 0.49 µm.

Boron is implanted by the ion implantation described above also into the first isolation insulating film 13a on the first p-well 27. With respect to the boron distribution in the first isolation insulating film 13a, the peak concentration is $8 \times 10^{17}$ cm$^{-3}$, and the peak depth is about 0.24 µm.

Then, the second resist pattern 31 is removed.

Figure 10:
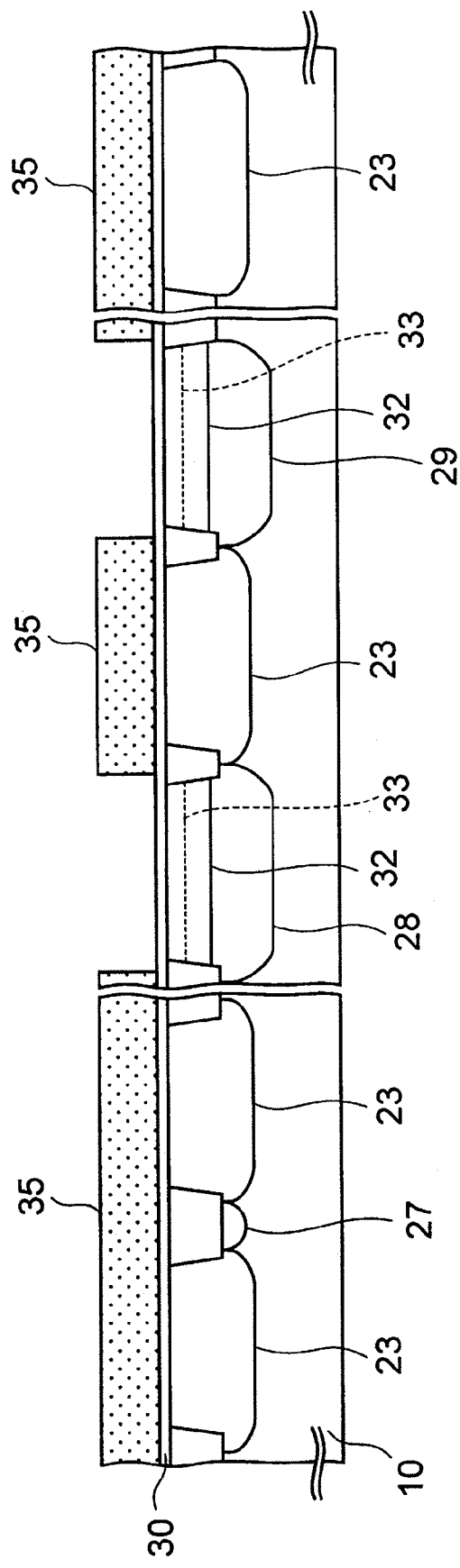

As illustrated in FIG. 10, a photoresist is applied again onto the second insulating film 30, and by exposing and developing the photoresist, a third resist pattern 35 is formed.

Using the third resist pattern 35 as a mask, boron is ion-implanted as a p-type impurity into the third region III and the fifth region V of the silicon substrate 10 to form p-type impurity regions 33 for threshold adjustment. Such ion implantation may also be referred to as "channel implantation".

The conditions for the ion implantation are not particularly limited. For example, the acceleration energy is set at 10 keV, the dose is set at $1.8 \times 10^{13}$ cm$^{-2}$, and the tilt angle is set at 7°. Then, the third resist pattern 35 is removed.

Figure 11:
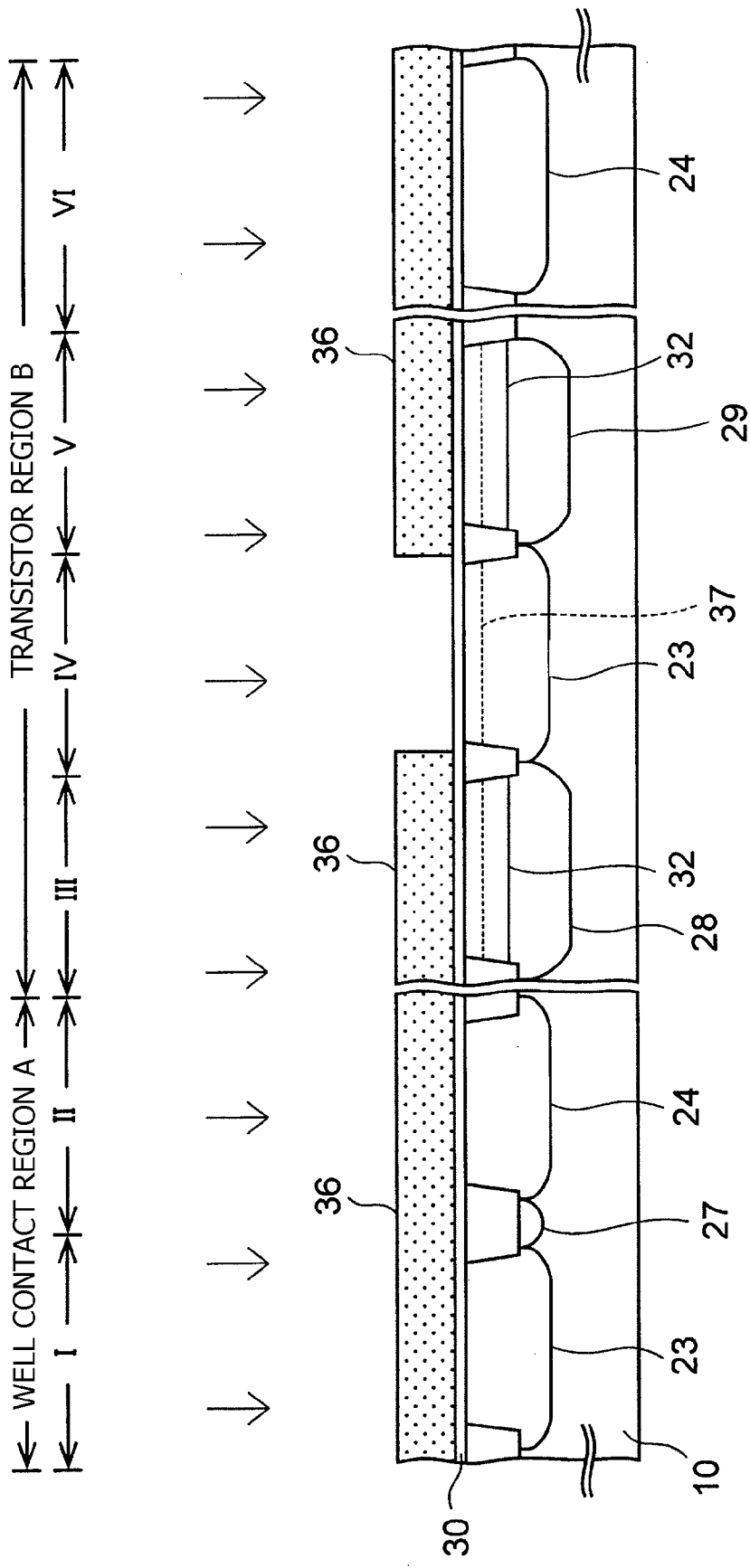

As illustrated in FIG. 11, a fourth resist pattern 36 is formed on the second insulating film 30. Using the fourth resist pattern 36 as a mask, arsenic is ion-implanted as an n-type impurity into the silicon substrate 10 to form a first n-type impurity region 37 for threshold adjustment in the fourth region IV. The ion implantation is performed, for example, at an acceleration energy of 100 keV, a dose of $2.3 \times 10^{13}$ cm$^{-2}$, and a tilt angle of 7°.

Figure 12:
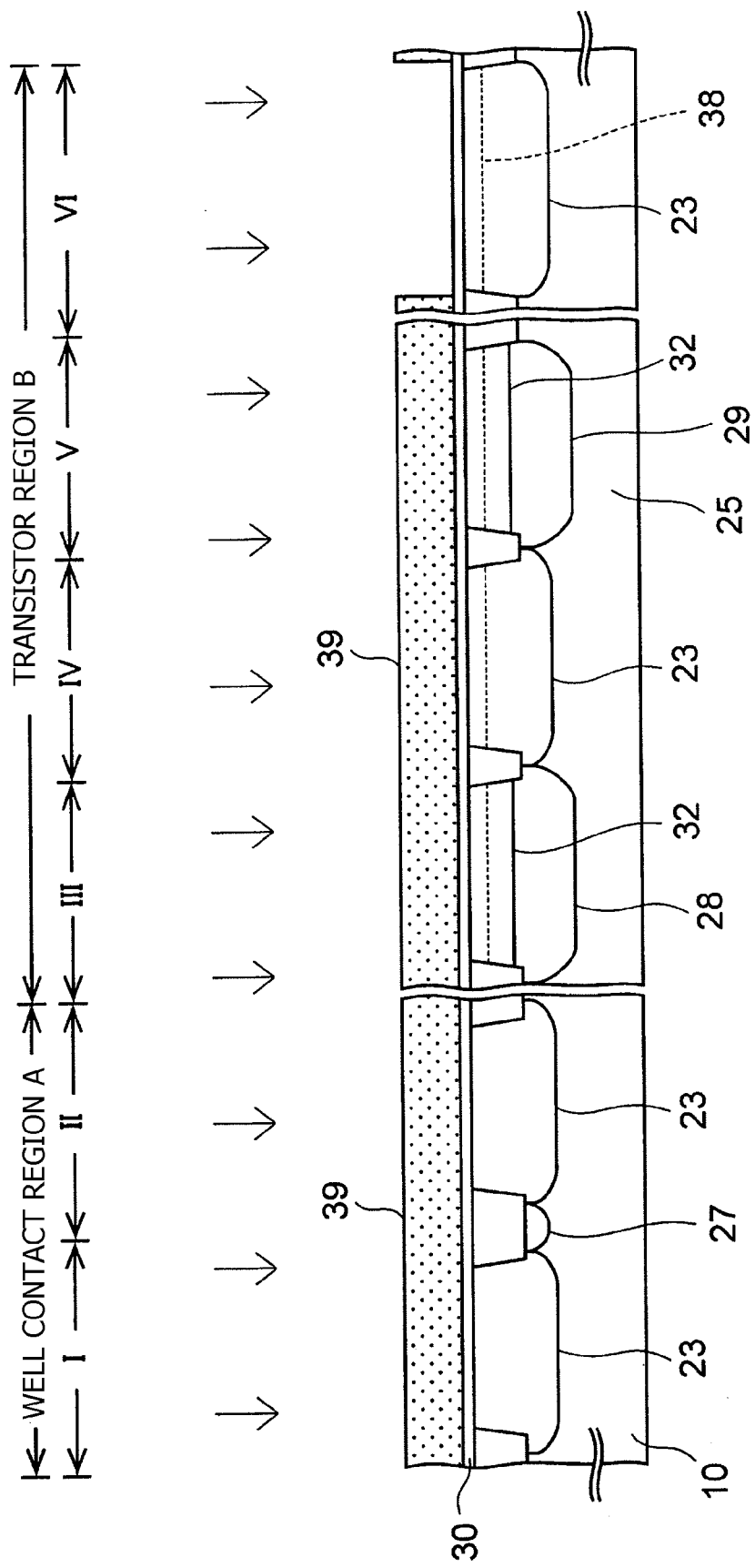

Furthermore, after the fourth resist pattern 36 is removed, as illustrated in FIG. 12, a fifth resist pattern 39 is formed on the second insulating film 30.

Using the fifth resist pattern 39 as a mask, arsenic is ion-implanted as an n-type impurity into the silicon substrate 10 in the sixth region VI to form a second n-type impurity region 38 for threshold adjustment. The ion implantation is performed, for example, at an acceleration energy of 100 keV, a dose of $4 \times 10^{12}$ cm$^2$, and a tilt angle of 7°. Then, the fifth resist pattern 39 is removed.

Figure 13:
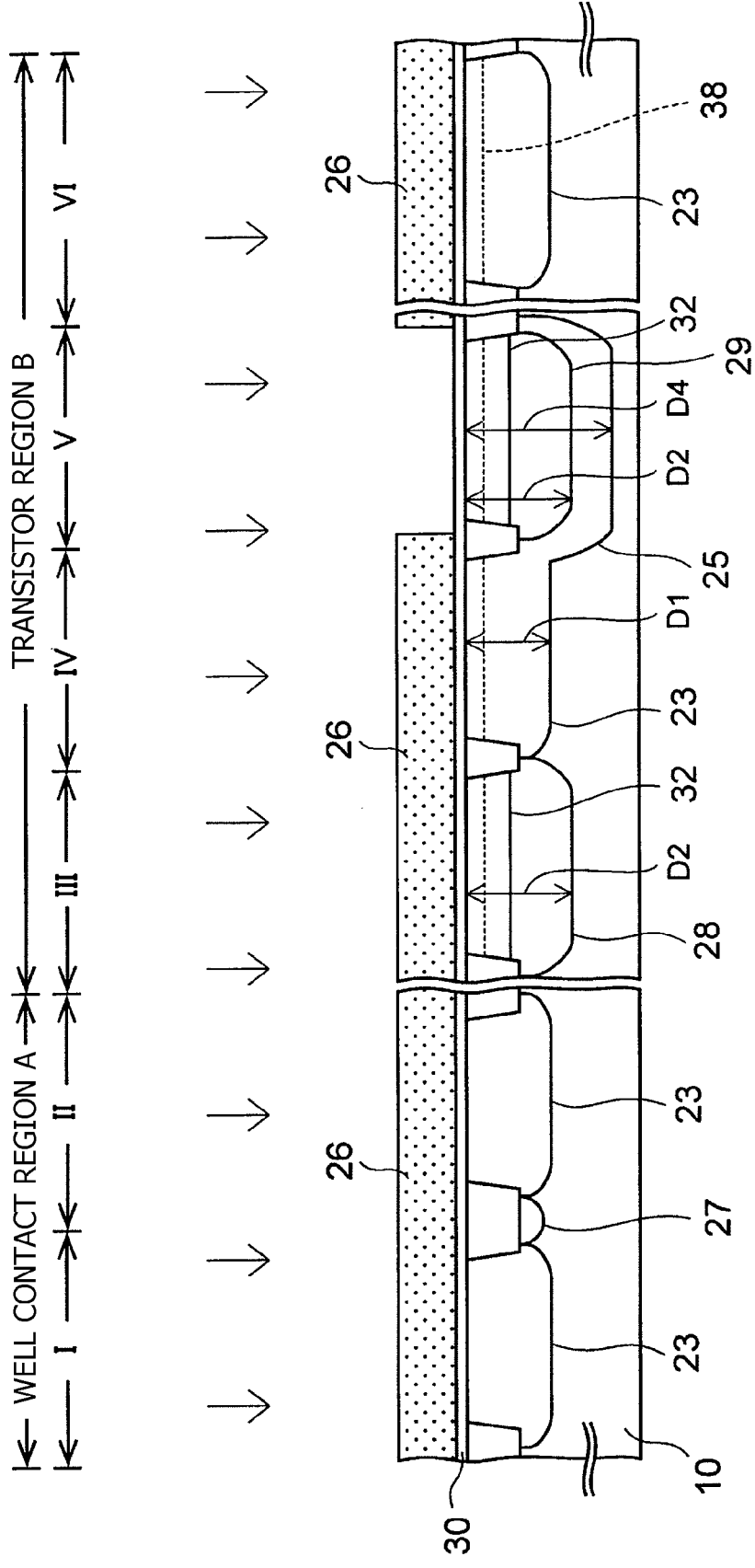

As illustrated in FIG. 13, a photoresist is applied again onto the second insulating film 30, and by exposing and developing the photoresist, a sixth resist pattern 26 is formed.

Using the sixth resist pattern 26 as a mask and using the second insulating film 30 as a through film, phosphorus is ion-implanted as an n-type impurity into the silicon substrate 10.

Thereby, a second n-well 25 is formed in the fifth region V of the silicon substrate 10 at a fourth depth D4 which is larger than the first depth D1. The second n-well 25 is formed as a deep n-well. For example, the ion implantation is performed under the conditions in which the acceleration energy is set at 700 keV to 900 keV, the dose is set at $2E10^{13}$ cm$^{-2}$±20%, and the tilt angle is set at 0°. Then, the sixth resist pattern 26 is removed.

Here, if the third p-well 29 is formed deeper than the second n-well 25, it is not possible to electrically isolate the third p-well 29 from its surrounding by the second n-well 25. Therefore, the second depth D2 is preferably smaller than the fourth depth D4.

Thereby, the third p-well 29 is formed deeply in the substrate within the range enclosed by the second n-well 25. Thus, it is possible to realize the third p-well 29 which is enclosed by the second n-well 25 and which has a low resistance.

Figure 14:
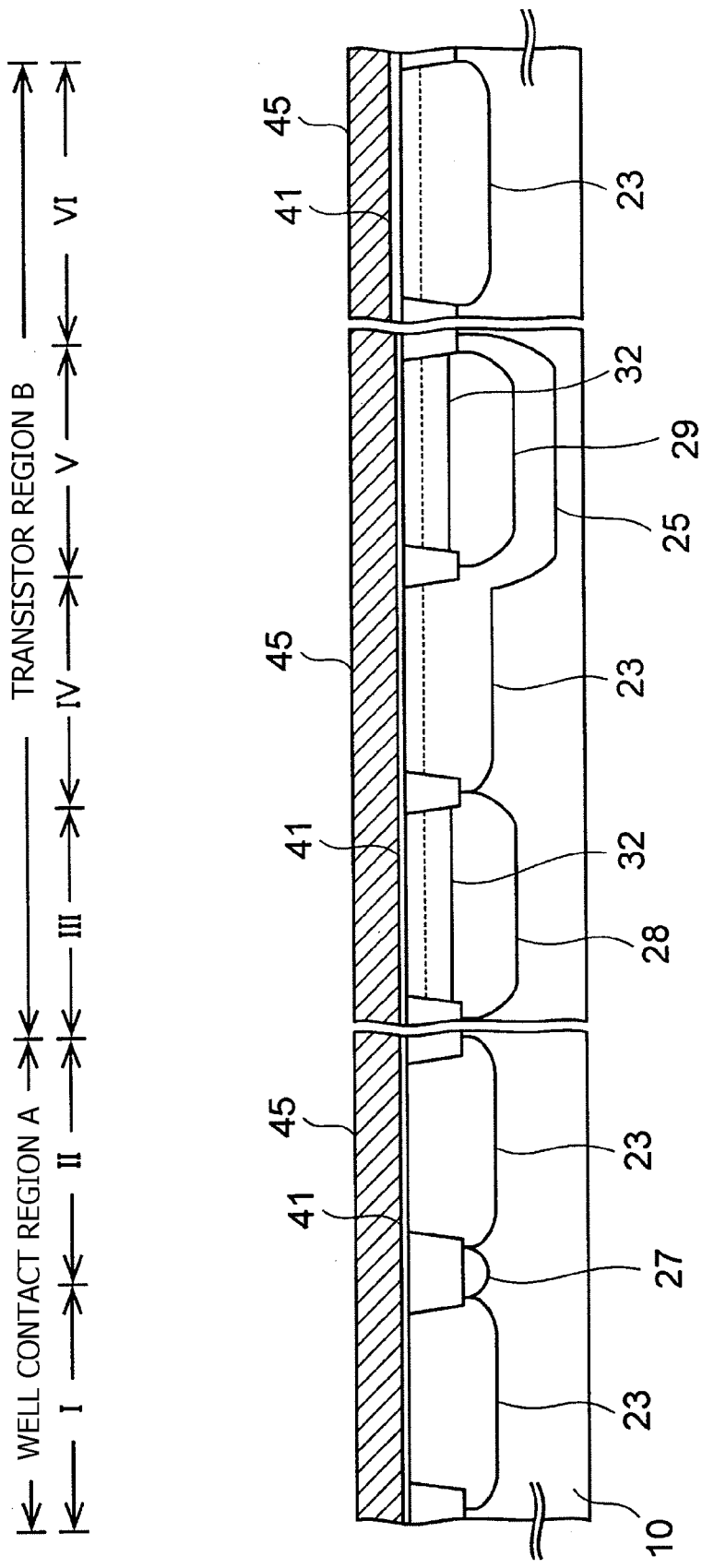

As illustrated in FIG. 14, by subjecting the surface of the silicon substrate 10 to thermal oxidation, a thermal oxide film which serves as a gate insulating film 41 is formed.

In the formation of the gate insulating film 41, after the silicon substrate 10 in the regions A and B is subjected to thermal oxidation, the thermal oxide film is removed by wet etching except for the thermal oxide film in the sixth region VI. Then, by subjecting the silicon substrate 10 to thermal oxidation again, the gate insulating film 41 is formed such that the thickness in the sixth region VI is larger than the thickness in the other regions.

Each thermal oxidation is performed, for example, by rapid thermal annealing (RTA). During the thermal oxidation, the substrate temperature is set at 1,000° C. and the treatment time is set at 10 seconds. When these conditions are met, the thickness of the gate insulating film 41 in the sixth region VI is 3.0 to 4.0 nm, and the thickness of the gate insulating film 41 in the regions other than the sixth region VI is about 1.5 to 1.7 nm.

A polysilicon film is formed at a thickness of 75 to 105 nm on the gate insulating film 41 by CVD using silane as a film forming gas at a substrate temperature of 590° C. to 610° C. The resulting polysilicon film is used as a conductive film 45.

Figure 15:
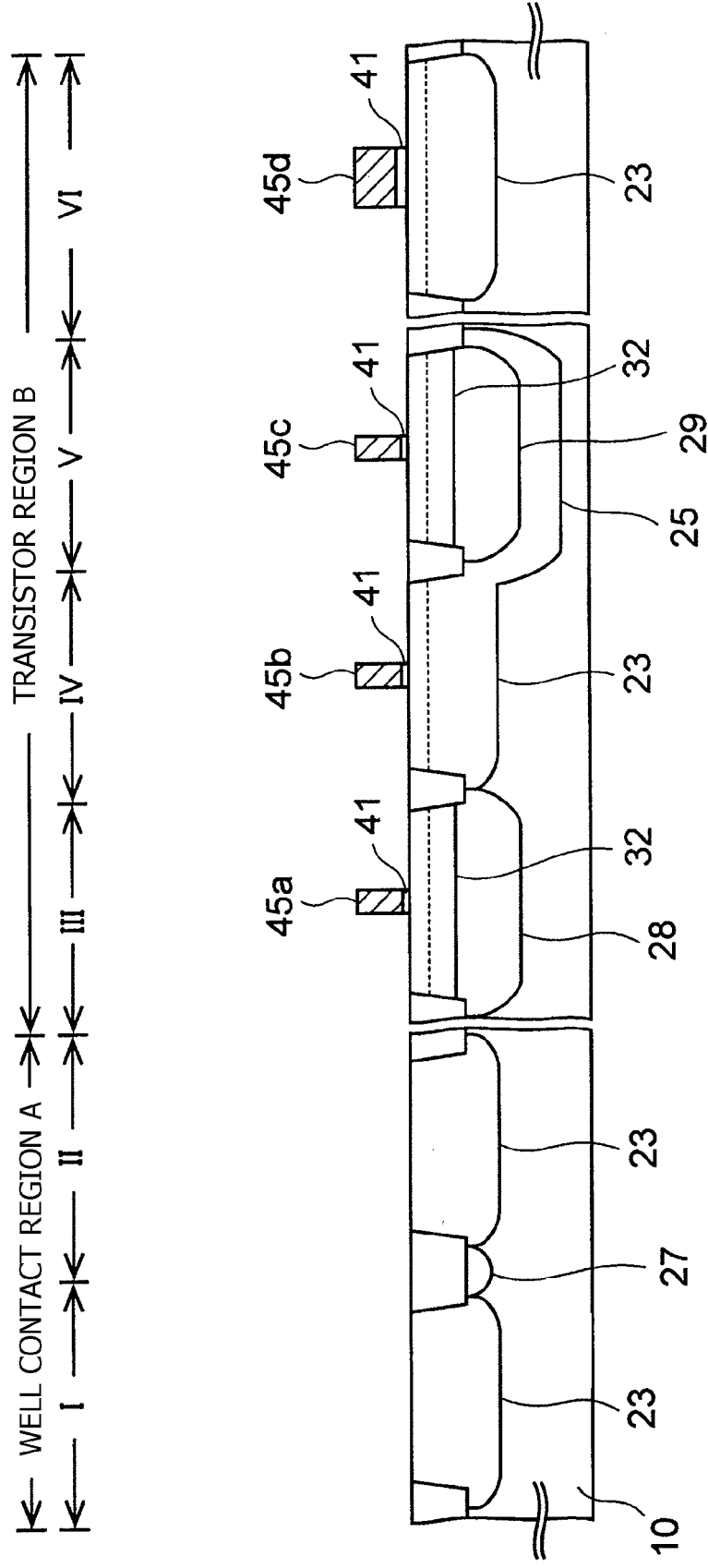

As illustrated in FIG. 15, the conductive film 45 is subjected to patterning using photolithography and dry etching to form a first gate electrode 45a, a second gate electrode 45b, a third gate electrode 45c, and a fourth gate electrode 45d in the third region III, the fourth region IV, the fifth region V, and the sixth regions VI, respectively.

A transistor having a higher operating voltage than transistors in the third region III, the fourth region IV, and the fifth region V is formed in the sixth region VI. Therefore, the fourth gate electrode 45d in the sixth region VI is formed with a larger gate length than the first gate electrode 45a, the second gate electrode 45b, and the third gate electrode 45c.

Figure 16:
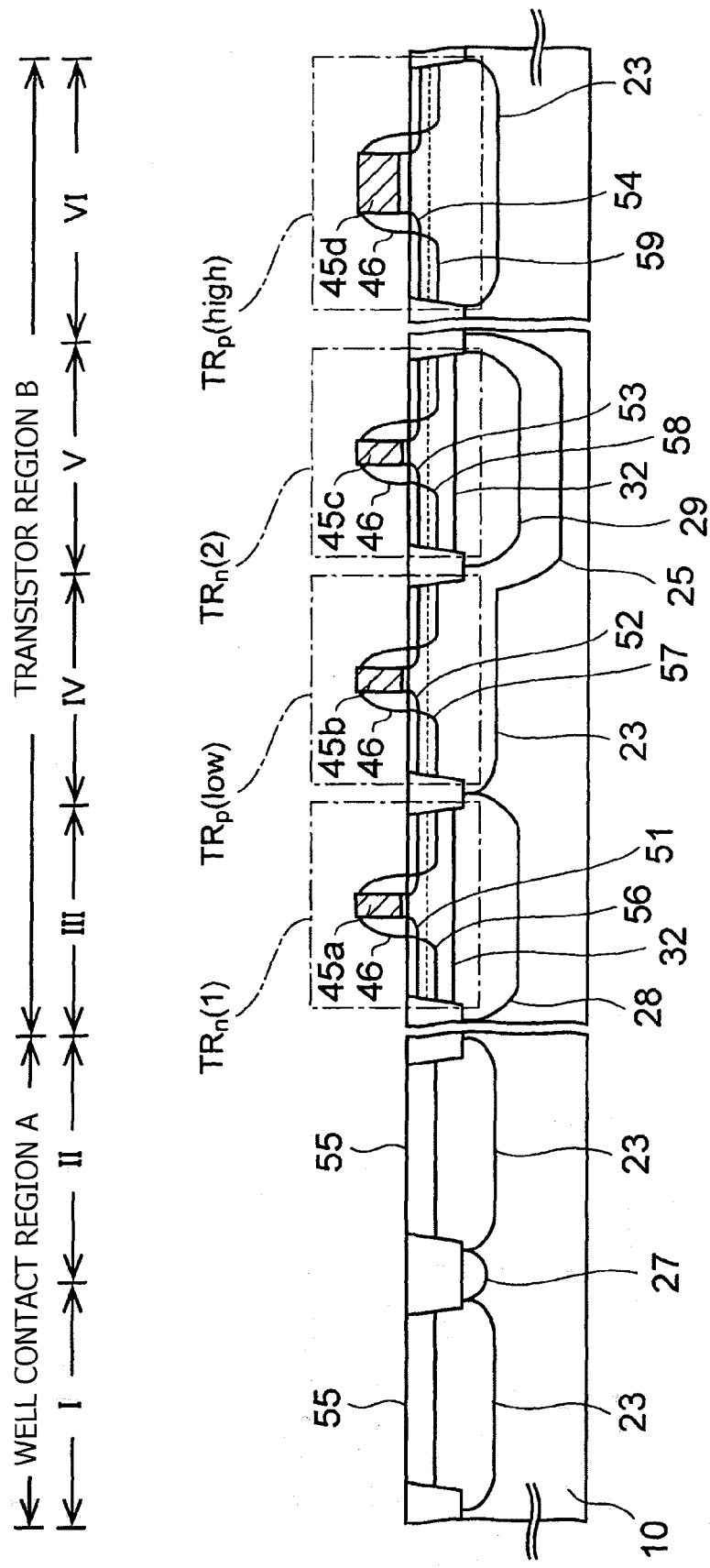

A process for obtaining the cross-sectional structure illustrated in FIG. 16 will be described below.

First n-type source/drain extensions 51, second n-type source/drain extensions 53, first p-type source/drain extensions 52, and second p-type source/drain extensions 54 are formed in the silicon substrate 10 by ion implantation using the first gate electrode 45a, the second gate electrode 45b, the third gate electrode 45c, and the fourth gate electrode 45d as masks.

The first n-type source/drain extensions 51 and the second n-type source/drain extensions 53 are formed by ion implantation of arsenic under the conditions in which the acceleration energy is set at 1 keV, the dose is set at $1 \times 10^{15}$ cm$^{-2}$, and the tilt angle is set at 0°.

The first p-type source/drain extensions 52 are formed by ion implantation of boron under the conditions in which the acceleration energy is set at 0.5 keV, the dose is set at $8 \times 10^{14}$ cm$^{-2}$, and the tilt angle is set at 0°.

As the impurity for forming the second p-type source/drain extensions 54, boron is used, and the ion implantation is performed, for example, at an acceleration energy of 2 keV, a dose of $6 \times 10^{13}$ cm$^{-2}$, and a tilt angle of 0°.

Before the source/drain extensions 51 to 54 are formed, pocket implantation may be performed.

In pocket implantation for the second p-well 28 and the third p-well 29, indium is ion-implanted under the conditions in which the acceleration energy is set at 40 keV, the dose is set at $9 \times 10^{12}$ cm$^{-2}$, the tilt angle is set at 30°.

In pocket implantation for the first n-wells 23, arsenic is used as an impurity, and the implantation is performed, for example, under the conditions in which the acceleration energy is set at 60 keV, the dose is set at $5 \times 10^{12}$ cm$^{-2}$, and the tilt angle is set at 30°.

An insulating film is formed over the entire upper surface of the silicon substrate 10. The insulating film is etched back to leave insulating sidewalls 46 with a width of about 70 nm on the sides of each of the first gate electrode 45a, the second gate electrode 45b, the third gate electrode 45c, and the fourth gate electrode 45d. As the insulating film, for example, a silicon oxide film with a thickness of 70 nm is formed by CVD at a substrate temperature of 520° C.

First n-type source/drain regions 56, second n-type source/drain regions 58, first p-type source/drain regions 57, and second p-type source/drain regions 59 are formed in the silicon substrate 10 by ion implantation using the insulating sidewalls 46, the first gate electrode 45a, the second gate electrode 45b, the third gate electrode 45c, and the fourth gate electrode 45d as masks.

The conditions for the ion implantation are not particularly limited. In this embodiment, two-step ion implantation is performed as follows.

First, in forming the first n-type source/drain regions 56 and the second n-type source/drain regions 58, in the first ion implantation step, phosphorus is ion-implanted at an acceleration energy of 15 keV, a dose of $5 \times 10^{13}$ cm$^{-2}$, and a tilt angle of 0°.

In the second step, phosphorus is ion-implanted at an acceleration energy of 8 keV, a dose of $1 \times 10^{16}$ cm$^{-2}$ and a tilt angle of 0°.

When the first n-type source/drain regions 56 and the second n-type source/drain regions 58 are formed, at the same time, phosphorus is also ion-implanted as an n-type impurity into the well contact region A to form n-type impurity regions 55.

In the first ion implantation step for forming the first p-type source/drain regions 57 and the second p-type source/drain regions 59, boron is implanted. The implantation is performed, for example, under the conditions in which the acceleration energy is set at 8 keV, the dose is set at $1 \times 10^{13}$ cm$^{-2}$, and the tilt angle is set at 0°. In the second step, boron is ion-implanted under the conditions in which the acceleration energy is set at 4 keV, the dose is set at $6 \times 10^{15}$ cm$^{-2}$, and the tilt angle is set at 0°.

By carrying out the steps described above, a basic structure including a first n-type MOS transistor TR$_n$(1), a second n-type MOS transistor TR$_n$(2), a low-voltage p-type MOS transistor TR$_p$(low), and a high-voltage p-type MOS transistor TR$_p$(high) is completed in the transistor region B of the silicon substrate 10.

Among these transistors, the high-voltage p-type MOS transistor TR$_p$(high) has a thicker gate insulating film and a larger gate length than the low-voltage p-type MOS transistor TR$_p$(low) and has a higher driving voltage than the low-voltage p-type MOS transistor TR$_p$(low).

The driving voltage of each of the transistors is not particularly limited. For example, the gate voltage of each of the low-voltage p-type MOS transistor TR$_p$(low), the first n-type MOS transistor TR$_n$(1), and the second n-type MOS transistor TR$_n$(2) is 1.1 V and the gate voltage of the high-voltage p-type MOS transistor TR$_p$(high) is 1.8 V.

As activation annealing for activating impurities in the source/drain regions 56 to 59, RTA is performed at a substrate temperature of 1,030° C. with a treatment time of one second.

Figure 17:
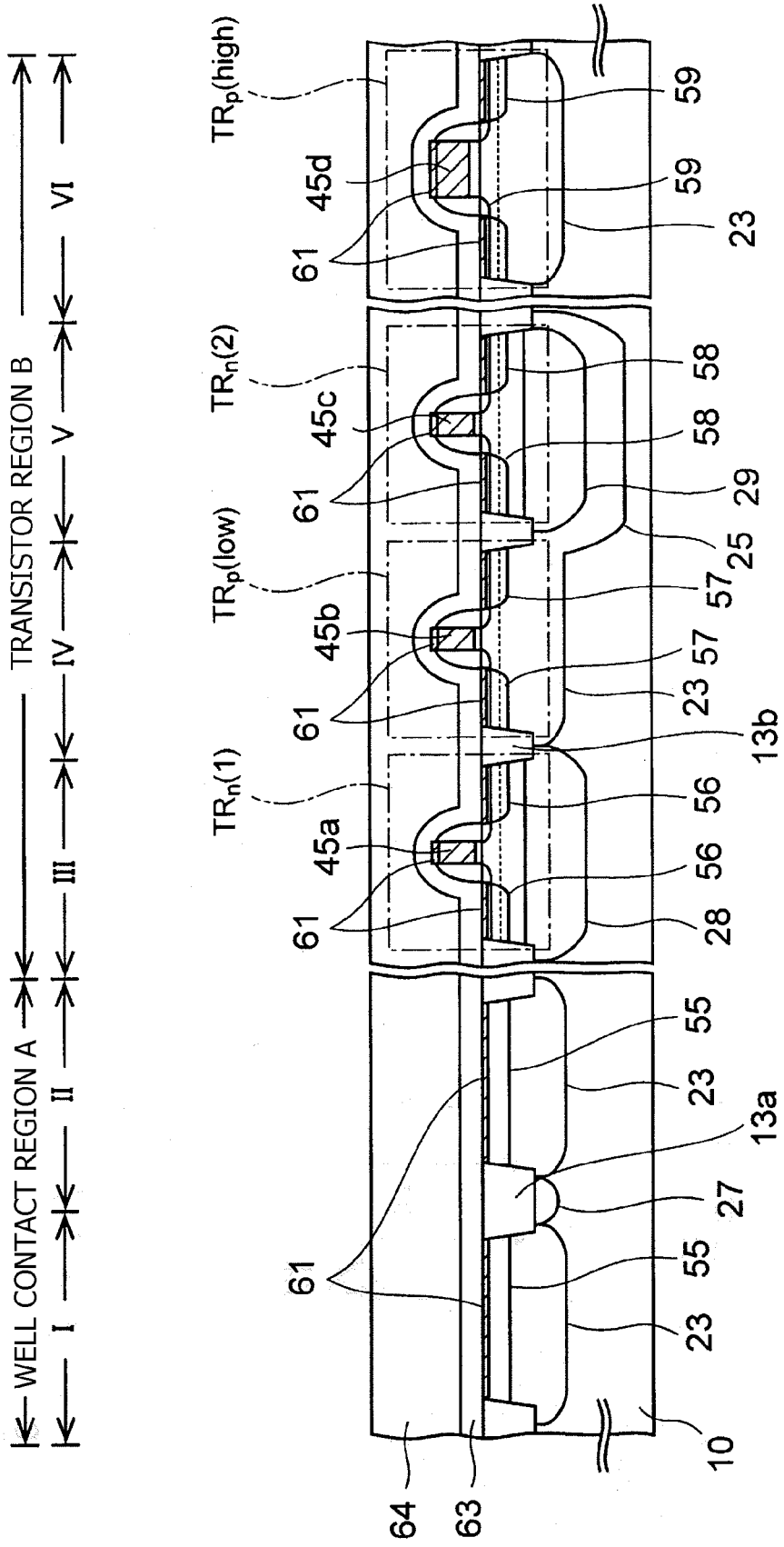

A process for obtaining the cross-sectional structure illustrated in FIG. 17 will be described below.

A cobalt film is formed by sputtering over the entire upper surface of the silicon substrate 10, and the cobalt film is allowed to react with silicon by heating to form cobalt silicide as a high-melting-point metal silicide film 61.

The unreacted cobalt film on the first isolation insulating film 13a, the second isolation insulating film 13b, and the like is removed by wet etching such that the high-melting-point metal silicide film 61 remains only on the silicon substrate 10, the first gate electrode 45a, the second gate electrode 45b, the third gate electrode 45c, and the fourth gate electrode 45d.

A silicon nitride film is formed as a cover insulating film 63 by CVD over the entire upper surface of the silicon substrate 10. The silicon nitride film is formed, for example, under the conditions in which the substrate temperature is set at about 600° C. and the thickness is set at about 80 nm.

A silicon oxide film is formed as an interlayer insulating film 64, by CVD using TEOS gas, with a thickness of about 145 nm on the cover insulating film 63. Then, the upper surface of the interlayer insulating film 64 is planarized by polishing by CMP.

Figure 18:
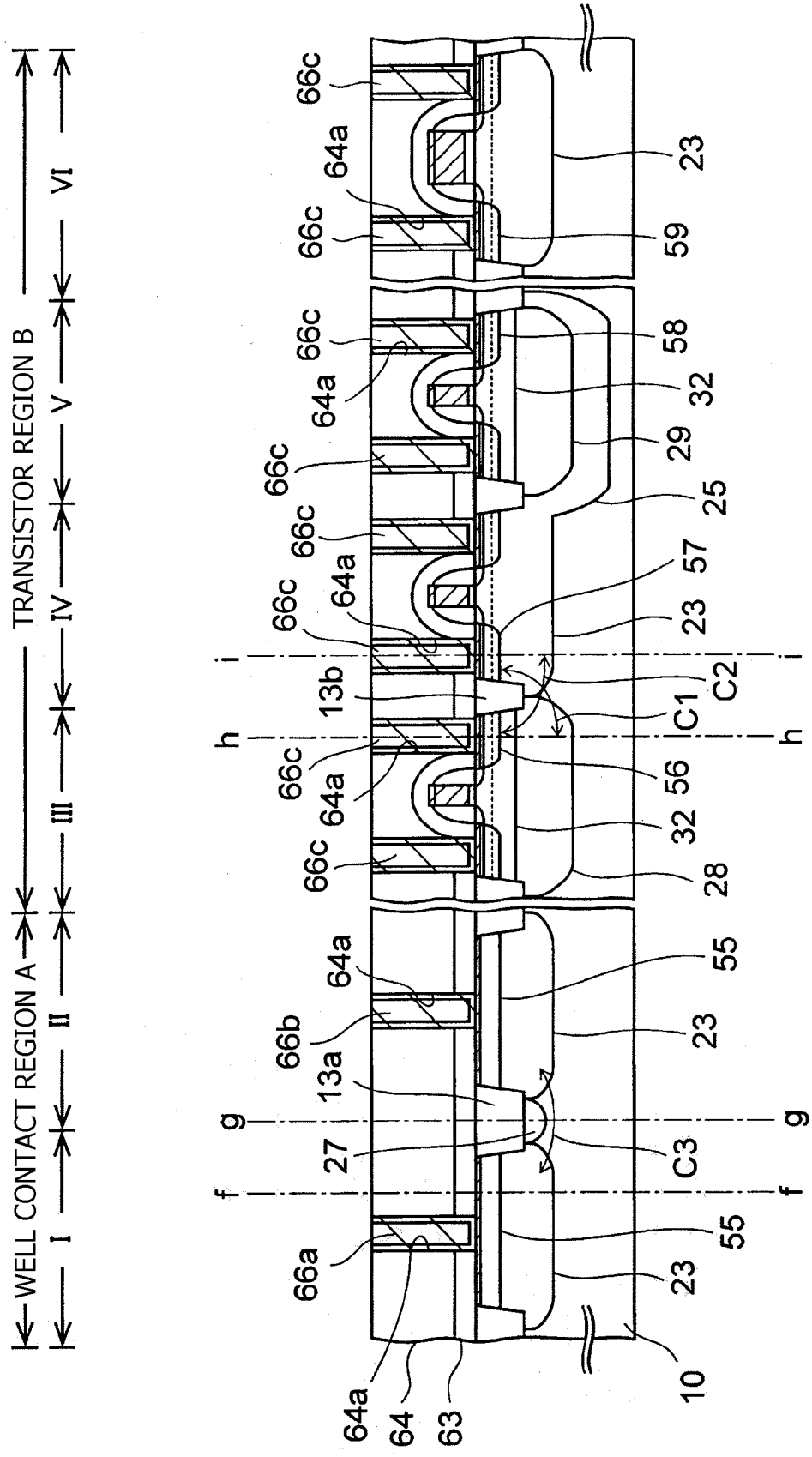

As illustrated in FIG. 18, the interlayer insulating film 64 and the cover insulating film 63 are subjected to patterning using photolithography and dry etching to form contact holes 64a in the source/drain regions 56 to 59 and the insulating films 63 and 64 in the well contact region A.

A first conductive plug 66a, a second conductive plug 66b, and third conductive plugs 66c are formed in the contact holes 64a. The conductive plugs 66a to 66c are formed, for example, by a method in which the contact holes 64a are embedded with a glue film formed by sputtering and a tungsten film formed by CVD, and then the excess glue film and tungsten film on the interlayer insulating film 64 are removed by polishing by CMP.

As the glue film, a metal laminated film with a thickness of 14 nm is formed, the metal laminated film being formed by stacking a titanium film and a titanium nitride film in that order, and the tungsten film is formed with a thickness of about 200 nm.

The first conductive plug 66a and the second conductive plug 66b thus formed are electrically connected to the silicon substrate 10 in the first region I and the second region II, respectively, and the third conductive plugs 66c are electrically connected to the silicon substrate 10 in the third region III, the fourth region IV, the fifth region V, and the sixth region VI.

The potential of the first conductive plug 66a is imparted through the first n-well 23 in the first region I to the first n-well 23 in the fourth region IV, and thereby, a well potential required for driving the low-voltage p-type MOS transistor TR$_p$(low) is applied.

The potential of the second conductive plug 66b is imparted through the first n-well 23 in the second region II to the first n-well 23 in the sixth region VI, and thereby, a well potential required for driving the high-voltage p-type MOS transistor TR$_p$(high) is applied.

Since the transistor TR$_p$(low) and the transistor TR$_p$(high) have different operating voltages, different potentials corresponding to the operating voltages are applied to the first conductive plug 66a and the second conductive plug 66b.

Figure 8:
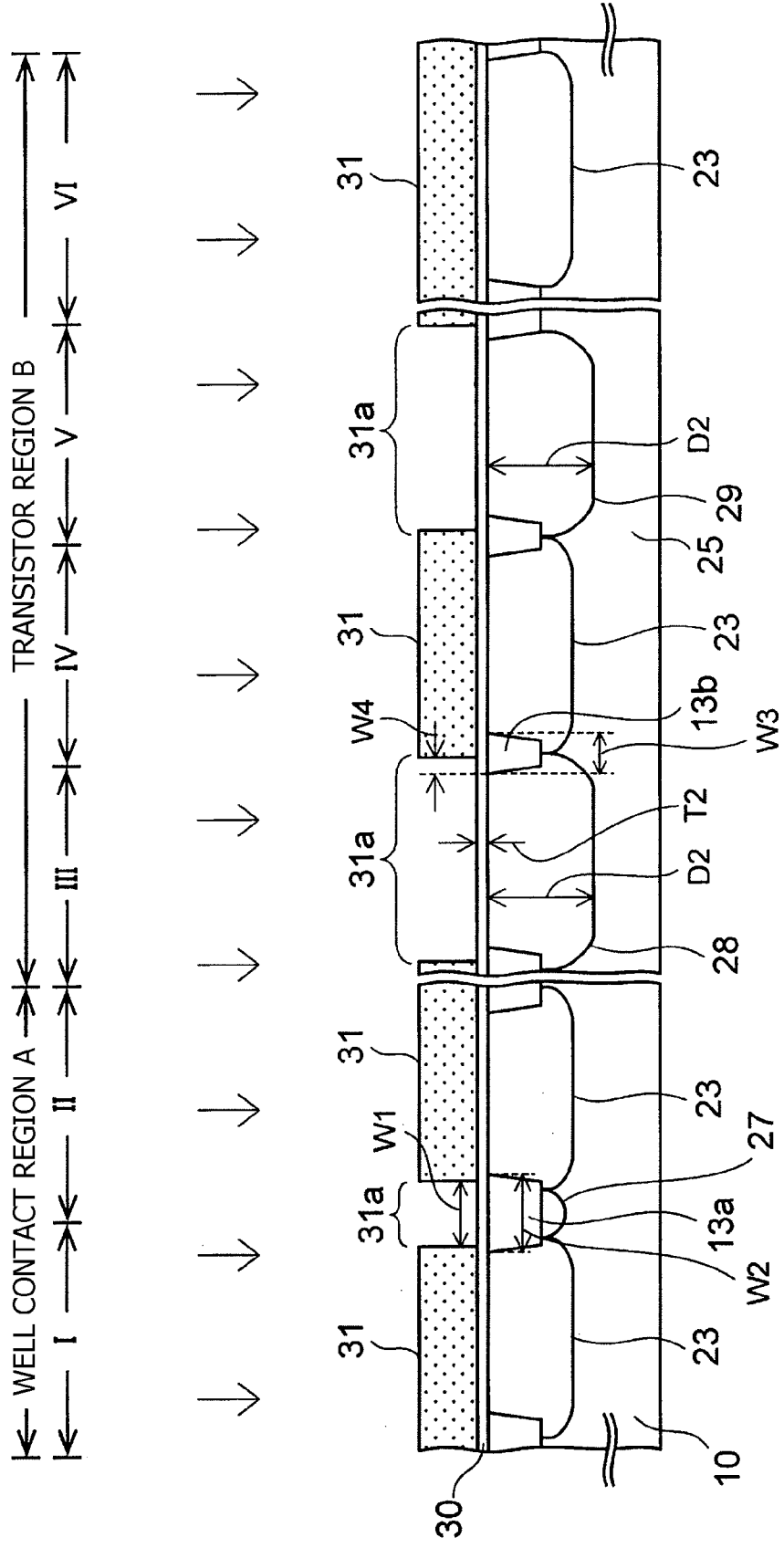

According to this embodiment, as illustrated in FIG. 7, the thickness T1 of the first insulating film 21 is set larger than the thickness T2 of the second insulating film 30 illustrated in FIG. 8. Consequently, the directivity of the impurity during the formation of the first n-well 23 using the first insulating film 21 as a through film is disturbed compared with the case where the second p-well 28 is formed using the second insulating film 30 as a through film, and channeling of the impurity may be suppressed.

As a result, the first n-well 23 is formed in the silicon substrate 10 at a depth smaller than that of the second p-well 28, and the concentration of the n-type impurity in the first n-well 23 on the side of the second isolation insulating film 13b is increased.

Consequently, it is possible to increase the potential barrier due to the p-n junction between the second p-well 28 and the first n-well 23, and isolation by the second isolation insulating film 13b may be securely performed.

In this embodiment, as illustrated in FIG. 9, since the fourth p-well 32 is formed in the second p-well 28 by performing additional ion implantation, the p-type impurity concentration on the side of the second isolation insulating film 13b may be increased. Consequently, the potential barrier due to the p-n junction between the wells 23 and 28 is further increased, and isolation may be more securely performed.

As a result, it is possible to prevent punch-through from occurring along the path C1 between the second p-well 28 and the first p-type source/drain region 57 or punch-through occurring along the path C2 between the first n-well 23 and the first n-type source/drain region 56.

In the well contact region A, as described above, since the first n-wells 23 are formed shallowly, the first p-well 27 is located at the side of the bottoms of the first n-wells 23. Consequently, the two first n-wells 23 may be securely electrically isolated by the first p-well 27, and it is possible to suppress punch-through along the path C3.

As described above, in this embodiment, since occurrence of punch-through along the paths C1 to C3 may be suppressed, the amount of leakage current caused by punch-through may be decreased, and the isolation breakdown voltage between elements may be increased.

Next, a study conducted by the inventor of the present application in association with this embodiment will be described.

As described above, in this embodiment, by forming the first insulating film 21 with a thickness that is larger than the thickness of the second insulating film 30, the first n-wells 23 are formed shallowly.

It may be considered that, by simply decreasing acceleration energy for ion implantation in the formation of the first n-wells 23, the first n-wells 23 may be formed shallowly.

Figure 19:
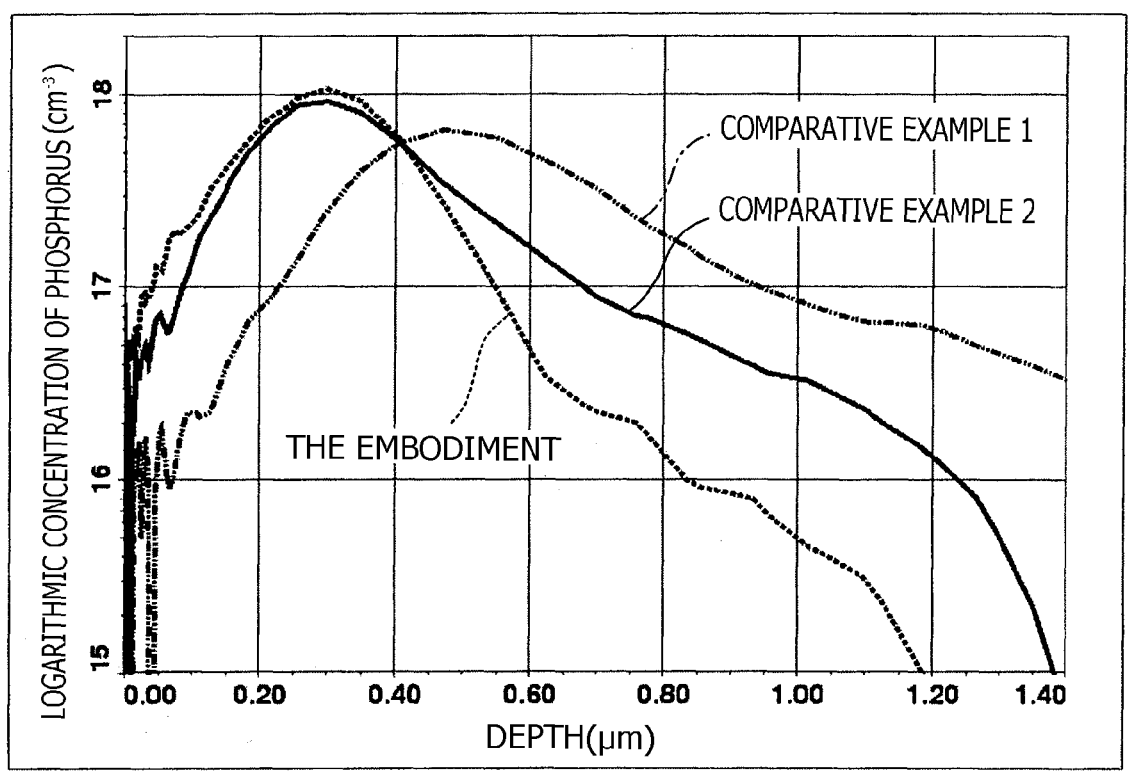
FIG. 19 is a graph illustrating impurity concentration profiles in the first embodiment and Comparative Examples 1 and 2.

FIG. 19 is a graph which illustrates differences in the impurity concentration profile due to differences in the technique for forming the first n-wells 23 shallowly. In FIG. 19, the horizontal axis represents the depth from the surface of the silicon substrate 10, and the vertical axis represents the logarithmic concentration of phosphorus.

In Comparative Example 1 in FIG. 19, the thickness of the first insulating film 21 is set at 10 nm, which is smaller than that in this embodiment, and the first n-wells 23 are formed under the same ion implantation conditions as those in this embodiment.

As illustrated in the concentration profile of Comparative Example 1, when the thickness of the first insulating film 21 is decreased, phosphorus is ion-implanted into a region that is deeper than that in this embodiment, and the first n-wells 23 may not be formed shallowly. The reason for this is that the directivity of ion-implanted phosphorus may not be sufficiently disturbed by the thin first insulating film 21, and some phosphorus may reach the deep portion of the silicon substrate 10 because of channeling.

In Comparative Example 2, the thickness of the first insulating film 21 is set at 10 nm, which is smaller than that in this embodiment, and the acceleration energy for ion implantation is set at 220 keV, which is smaller than that in this embodiment, and the phosphorus concentration profile is obtained. The dose and the tilt angle in Comparative Example 2 are the same as those in this embodiment.

As illustrated in the concentration profile of Comparative Example 2, when the acceleration energy is decreased, the concentration peak becomes shallower than that of Comparative Example 1, and the concentration peak is located at substantially the same depth as that in this embodiment.

However, in the concentration profile of Comparative Example 2, tailing referred to as a "channeling tail" occurs, and phosphorus is implanted into a portion of the substrate deeper than that in this embodiment. The reason for this is that, as in Comparative Example 1, channeling may not be suppressed sufficiently by the thin first insulating film 21.

As is evident from this result, when acceleration energy is simply decreased, a channeling tail occurs, and it is difficult to form the first n-wells 23 shallowly.

Figure 20:
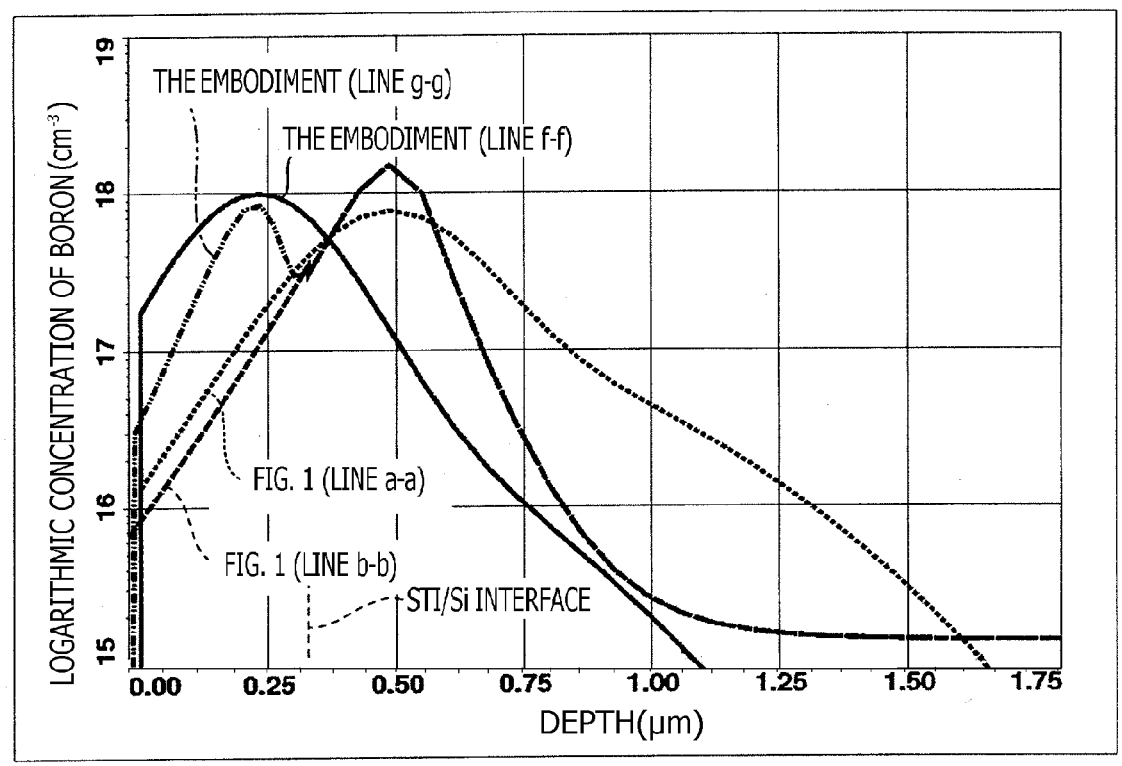
FIG. 20 is a graph illustrating boron concentration profiles in the semiconductor device according to the first embodiment and the semiconductor device illustrated in FIG. 1.

FIG. 20 is a graph which illustrates differences in the boron concentration profile with respect to the semiconductor device in this embodiment and the semiconductor device of FIG. 1. The horizontal axis represents the depth from the surface of the silicon substrate 10, and the vertical axis represents the logarithmic concentration of boron.

In this embodiment, concentration profiles along the line g-g and the line f-f in FIG. 18 were studied. With respect to the semiconductor device described with reference to FIG. 1, concentration profiles along the line a-a and the line b-b were studied.

Among these cross-sectional lines, each of the line g-g of this embodiment and the line b-b of FIG. 1 is a cross-sectional line passing through the first isolation insulating film 13a.

As illustrated in FIG. 20, two peaks appear in the concentration profile along the line g-g of this embodiment. The shallower peak from the substrate surface is located inside the first isolation insulating film 13a. This peak corresponds to the additional ion implantation of boron described with reference to FIG. 9 and does not appear in the concentration profile along the line b-b of FIG. 1.

Figure 21:
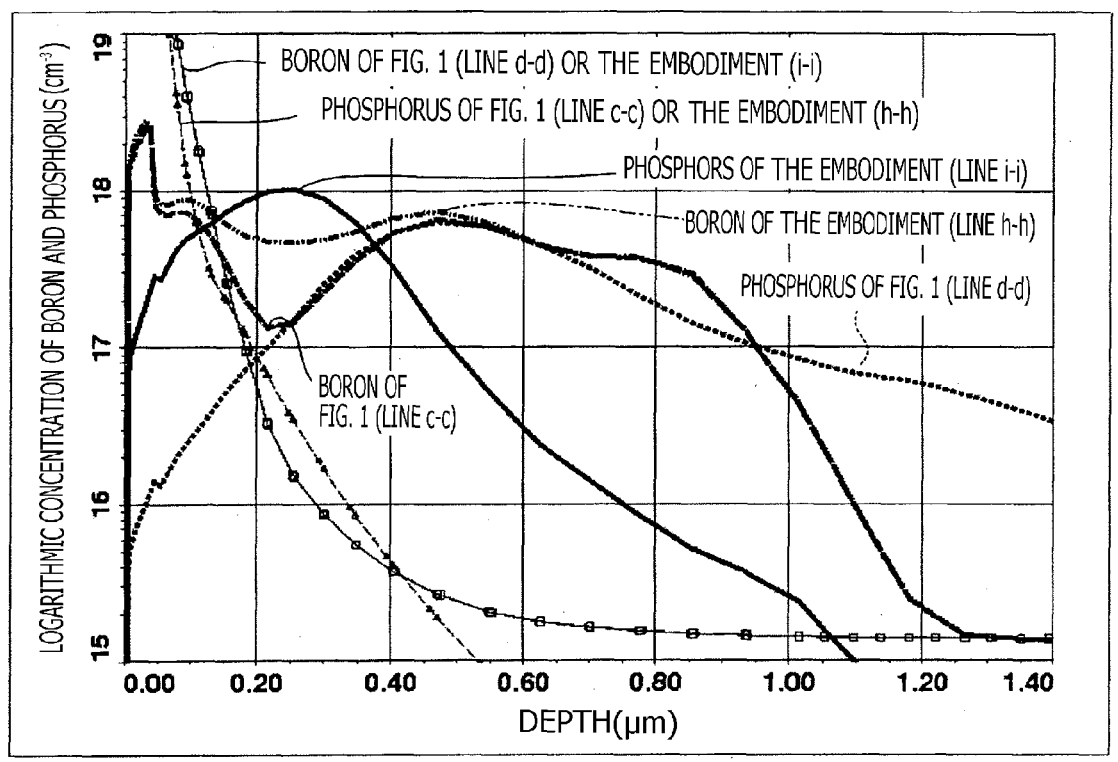
FIG. 21 is a graph illustrating impurity concentration profiles in the semiconductor device according to the first embodiment and the semiconductor device illustrated in FIG. 1.

FIG. 21 is a graph which illustrates differences in the impurity concentration profile with respect to the semiconductor device in this embodiment and the semiconductor device of FIG. 1 and which illustrates concentration profiles in cross-sections which are different from the cross-sections illustrated in FIG. 20.

In FIG. 21, with respect to this embodiment, concentration profiles along the line h-h and the line i-i in FIG. 18 were studied, and with respect to FIG. 1, concentration profiles along the line c-c and the line d-d were studied.

As illustrated in FIG. 21, in this embodiment, the phosphorus concentration profile along the line i-i terminates at a portion of the substrate shallower than the boron concentration profile along the line h-h. Since the line i-i passes through the first n-well 23 and the line h-h passes through the second p-well 28, it is confirmed that the first n-well 23 is formed shallower than the second p-well 28 in this embodiment.

Furthermore, the boron concentration profile along the line h-h in this embodiment is shifted upward with respect to the concentration profile along the line c-c of FIG. 1. This is caused by the additional ion implantation of boron described with reference to FIG. 9.

The depth of the portion in which the boron concentration is shifted upward as described above is shallower than 0.33 μm which is the depth of the bottom of the second isolation insulating film 13b. This illustrates that the boron concentration of the second p-well 28 at the side of the second isolation insulating film 13b is increased by the additional ion implantation.

FIGS. 22A, 22B, and 22C are views obtained by simulation of impurity concentration distribution in the first n-wells 23 in the vicinity of the first isolation insulating film 13a. FIG. 22A illustrates the simulation result for the semiconductor device illustrated in FIG. 1. FIG. 22B illustrates the simulation result for the semiconductor device fabricated in this embodiment. FIG. 22C illustrates the phosphorus concentrations indicated by the hatchings illustrated in FIGS. 22A and 22B. The impurity subjected to simulation is phosphorus, and the distribution of impurities other than phosphorus is omitted. Note that the impurity concentration distribution is obtained after the high-melting-point metal silicide layer 61 illustrated in FIG. 17 is formed.

As illustrated in FIGS. 22A and 22B, in this embodiment, since the first insulating film 21 is formed with a larger thickness than the thickness of the second insulating film 30 so that channeling is suppressed during the formation of the first n-wells 23, the concentration profile moves toward the shallow portion of the substrate compared with the semiconductor device of FIG. 1. Accordingly, the junction J between the first n-well 23 and the p-type silicon substrate 10 also moves toward the substrate surface side.

FIGS. 23A, 23B, and 23C are views obtained by simulation of leakage current density of semiconductor devices. FIG. 23A illustrates the simulation result for the semiconductor device illustrated in FIG. 1. FIG. 23B illustrates the simulation result for the semiconductor device fabricated in this embodiment. FIG. 23C illustrates the current densities indicated by the hatchings illustrated in FIGS. 23A and 23B. The simulation was performed under the conditions in which, while the left first n-well 23 was maintained at a ground potential, a potential of +1 V was applied to the right first n-well 23.

As illustrated in FIGS. 23A and 23B, in the semiconductor device of FIG. 1, leakage current markedly occurs between the two first n-wells 23.

The reason for this is believed to be that since the junction J is located deeply in the substrate, the two first n-wells 23 are not satisfactorily isolated from each other by the first p-well 27 (not illustrated) which is formed in the shallow portion of the substrate, and punch-through occurs between the two first n-wells 23.

In contrast, in this embodiment, since the junction J is formed in the shallow portion of the substrate compared with the semiconductor device of FIG. 1, the two first n-wells 23 may be satisfactorily isolated from each other by the first p-well 27, and leakage current may be suppressed.

Figure 24A:
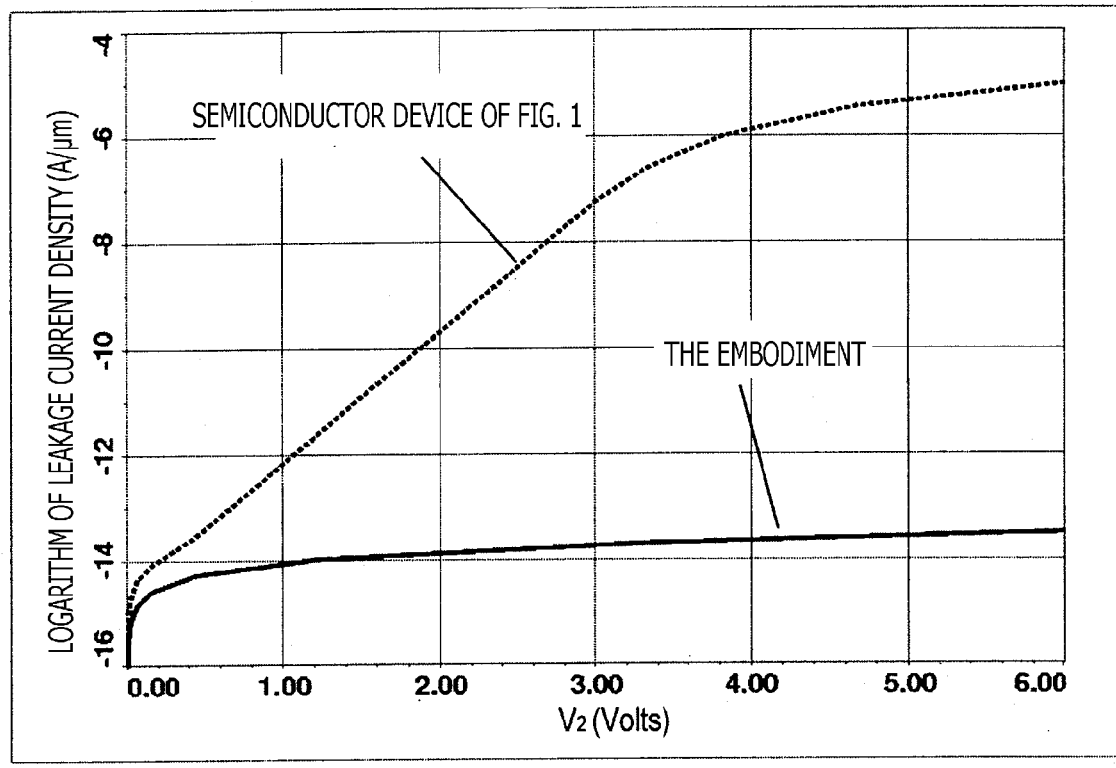
FIG. 24A is a graph illustrating the leakage current in the well contact region.

FIG. 24A includes a graph obtained by simulation of the leakage current density in the well contact region A.

In the simulation, while the potential $V_2$ of the right first n-well 23 was varied in the range of 0 V to +6 V, the leakage current density between the two first wells 23 was calculated.

Note that each of the potential $V_1$ of the left first n-well 23 and the potential $V_{sub}$ of the silicon substrate 10 is a ground potential.

Figure 24B:
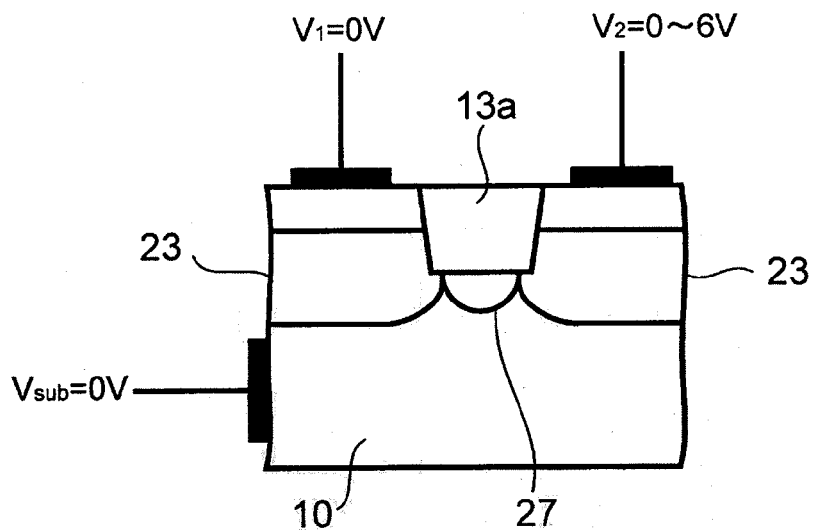
FIG. 24B is a cross-sectional view of a semiconductor device used in measurement of the leakage current in FIG. 24A.

The leakage current density was calculated by a method in which, in the cross-sectional view of FIG. 24B, an imaginary rectangle through which current passes was formed in a direction perpendicular to the sheet of the drawing, one side of the imaginary rectangle in the direction perpendicular to the sheet of the drawing was fixed at 1 μm, and the length of remaining one side was considered as a unit length. Consequently, in this simulation, the unit of measure of the leakage current density is A/μm.

With respect to the pattern size, simulation was performed by setting W1 in FIG. 8 to 0.8 μm and W2 to 1.08 μm. Note that W1 is the width of the window 31a of the second resist pattern 31, and W2 is the width of the first isolation insulating film 13a.

In FIG. 24A, the leakage current density value is represented by logarithm.

As illustrated in FIG. 24B, in this embodiment, even if the potential $V_2$ is increased, the leakage current density does not markedly increase.

In contrast, in the semiconductor device of FIG. 1, the leakage current density increases with an increase in the potential $V_2$.

This result confirms that it is effective for reducing leakage current in the well contact region A to set the thickness of the first insulating film 21 larger than the thickness of the second insulating film 30 as in this embodiment.

Figure 25A:
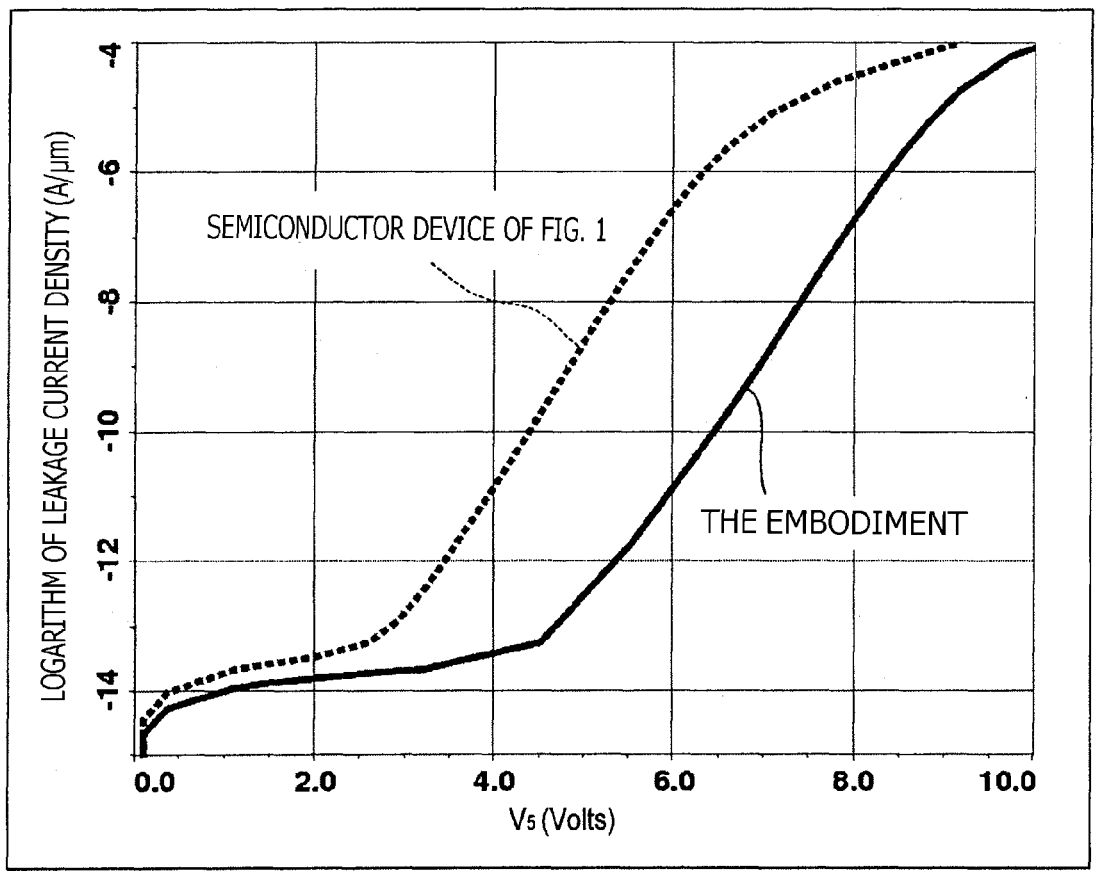
FIG. 25A is a graph illustrating the leakage current in the transistor region.
Figure 25B:
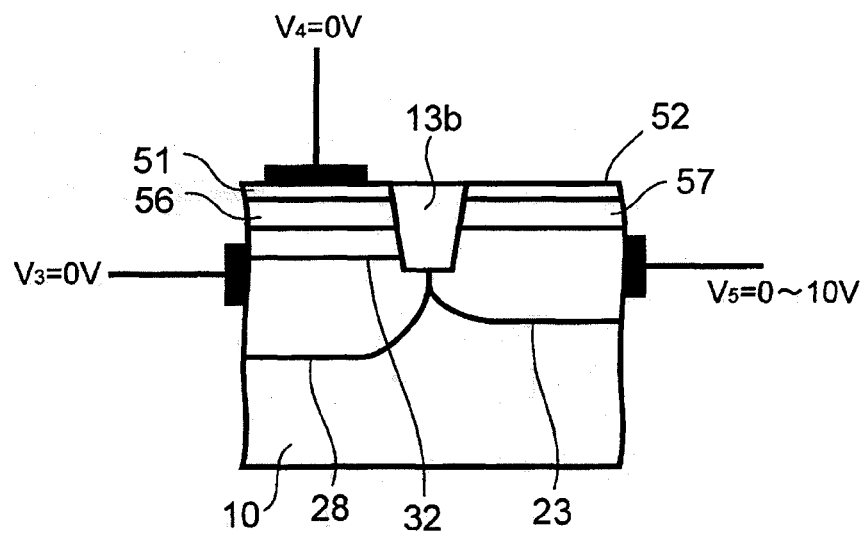
FIG. 25B is a cross-sectional view of a semiconductor device used in measurement of the leakage current in FIG. 25A.

FIG. 25A includes a graph obtained by simulation of the leakage current density in the transistor region B.

In this simulation, the potential $V_3$ of the second p-well 28 was set at a ground potential. The potential $V_4$ of each of the first n-type source/drain extension 51 and the first n-type source/drain region 56 was also set at the ground potential. In this state, while the potential $V_5$ of the first n-well 23 was varied in the range of 0 to +10 V, the leakage current density between the first n-type source/drain region 56 and the first n-well 23 was calculated.

With respect to the pattern size during simulation, W3 in FIG. 8 was set at 140 nm, and W4 was set at 70 nm. W3 is the width of the second isolation insulating film 13b. W4 is the receding amount of the second resist pattern 31 from the side face of the second isolation insulating film 13b. In the simulation, the receding amount W5 of the first resist pattern 22 from the side face of the second isolation insulating film 13b was set at 70 nm.

As illustrated in FIG. 25A, when compared at the same potential $V_5$, the leakage current density in this embodiment is smaller than the leakage current density in the semiconductor device of FIG. 1. As is evident from this result, this embodiment is effective for reducing the leakage current between the first n-type source/drain region 56 and the first n-well 23 in the transistor region B in comparison with the semiconductor device of FIG. 1.

Figure 26A:
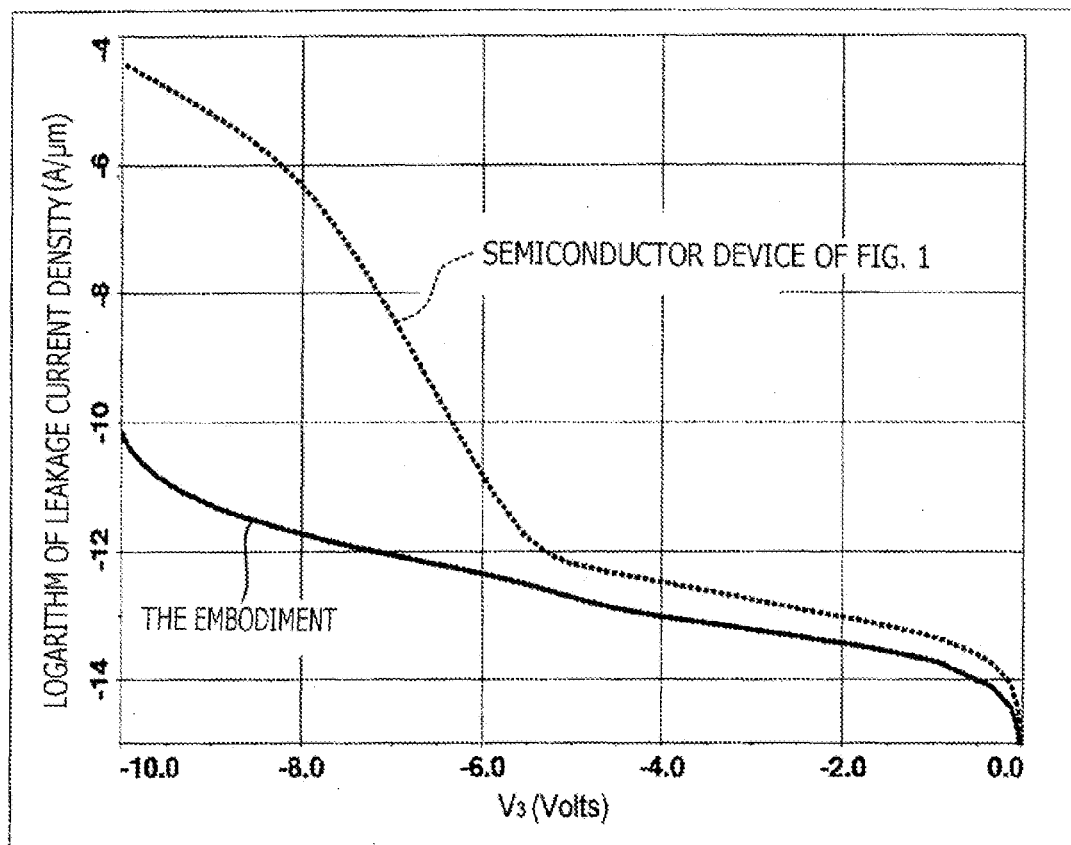
FIG. 26A is a graph illustrating the leakage current in the transistor region.

FIG. 26A includes a graph obtained by simulation of the leakage current density in the transistor region B in which the potentials are set differently from FIG. 25A.

In this simulation, the potential $V_5$ of the first n-well 23 was set at a ground potential. The potential of each of the first p-type source/drain extension 52 and the first p-type source/drain region 57 was also set at the ground potential.

In this state, while the potential $V_3$ of the second p-well 28 was varied in the range of 0 to −10 V, the leakage current density between the first p-type source/drain region 57 and the second p-well 28 was calculated.

As illustrated in FIG. 26A, when compared at the same potential $V_3$, the leakage current density in this embodiment is smaller than the leakage current density in the semiconductor device of FIG. 1, which confirms that this embodiment is effective for suppressing leakage current.

FIGS. 27A, 27B, and 27C are views illustrating the results of simulation of potential profiles in silicon substrates 10. FIG. 27A illustrates the results of simulation for the semiconductor device illustrated in FIG. 1. FIGS. 27B and 27C illustrate the results of simulation for the semiconductor device fabricated in this embodiment.

In this example, potential profiles were studied in the second isolation insulating film 13b and the second p-well 28 and the first n-well 23 located at both side of the second isolation insulating film 13b in the transistor region B.

In this simulation, the potential of each of the silicon substrate 10, and wells 23 and 28 are set at a ground potential.

Because of the calculation method, the arrangement is left-right reversed between the wells 23 and 28 compared with FIG. 18, etc.

As illustrated in FIG. 27A, in the semiconductor device of FIG. 1, the first n-well 23 is formed deeper than the second p-well 28, and the p-n junction between the first n-well 23 and the p-type silicon substrate 10 is formed at a deep portion of the substrate 10.

FIG. 27B illustrates the view in the case where the first n-well 23 is formed shallowly by setting the thickness of the first insulating film 21 at 210 nm as in this embodiment. However, additional ion implantation of the p-type impurity into the second p-well 28 (FIG. 9) is omitted.

As indicated by the arrow K in FIG. 27B, when the additional ion implantation is omitted, the potential of the first n-well 23 projects toward the second p-well 28, and the first n-well 23 and the first n-type source/drain region 56 come close to each other.

FIG. 27C illustrates the view in the case where, as in this embodiment, the thickness of the first insulating film 21 is set at 210 nm and as illustrated in FIG. 9, additional ion implantation of the p-type impurity is performed into the second p-well 28.

When the additional ion implantation is performed, projection of the potential of the first n-well 23 toward the second p-well 28 is suppressed.

As is evident from this result, the additional ion implantation of the p-type impurity into the second p-well 28 suppresses the first n-well 23 and the first n-type source/drain regions 56 from coming close to each other and is useful for suppressing the risk of flowing of leakage current therebetween.

Figure 28:
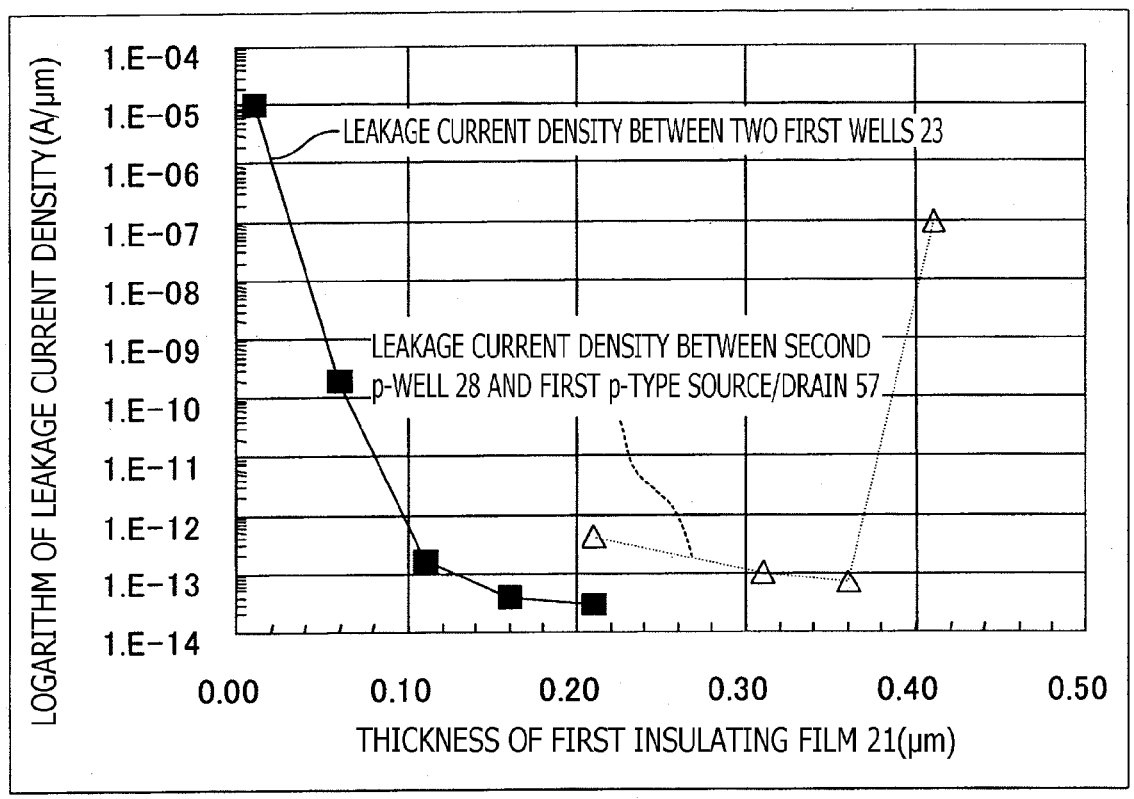
FIG. 28 is a graph illustrating the thickness of the first insulating film according to the first embodiment.

FIG. 28 is a graph obtained by simulation of the appropriate thickness of the first insulating film 21 used as a through film in the formation of first n-wells 23.

In FIG. 28, the line represented by black squares indicates the leakage current density between two n-wells 23 when a voltage $V_2$ was applied between the two n-wells 23 as described with reference to FIG. 24B. The absolute value of the voltage $V_2$ was fixed at 6 V. While the thickness of the first insulating film 21 was varied, the leakage current density between the two n-wells 23 was calculated.

Figure 26B:
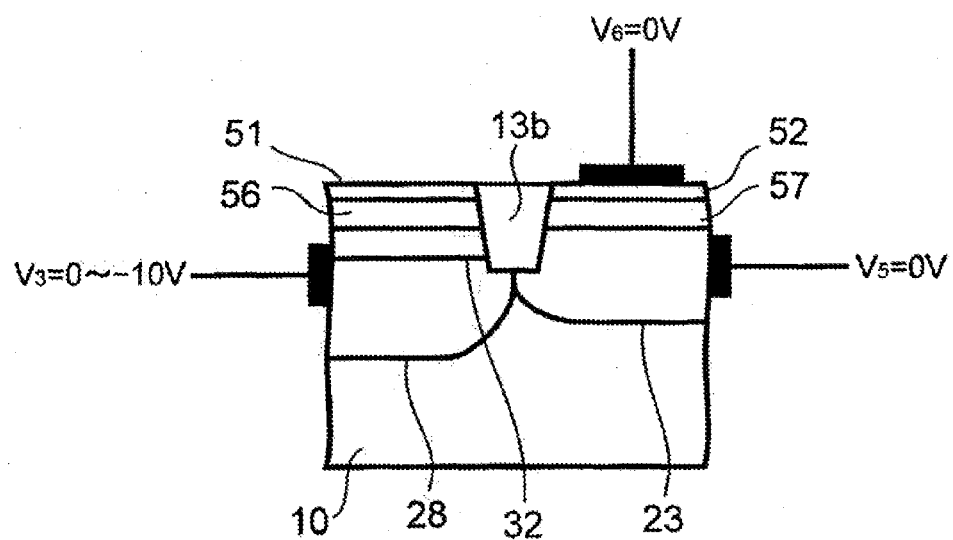
FIG. 26B is a cross-sectional view of a semiconductor device used in measurement of the leakage current in FIG. 26A.

The line represented by white triangles indicates the leakage current density between a first p-type source/drain region 57 and a second p-well 28 when a voltage $V_3$ was applied between the first p-type source/drain region 57 and the second p-well 28 as described with reference to FIG. 26B. The absolute value of the voltage $V_3$ was fixed at 6 V. While the thickness of the first insulating film 21 was varied, the leakage current density between the first p-type source/drain region 57 and the second p-well 28 was calculated.

As illustrated in FIG. 28, the leakage current density between the two first n-wells 23 indicated by black squares is maintained to be low when the thickness of the first insulating film 21 is in a range of 0.10 μm or more.

The leakage current density between the second p-well 28 and the first p-type source/drain 57 indicated by white triangles is maintained to be low when the thickness of the first insulating film 21 is in a range of 0.36 μm or less.

As is evident from this result, in order to simultaneously suppress the two types of leakage current described above, it is necessary to set the thickness of the first insulating film 21 in a range of 0.10 to 0.36 μm.

A second embodiment will be described below. In the first embodiment, as the first insulating film 21 which serves as a through film for first n-wells 23, single-layered silicon oxide film is formed. The structure of the first insulating film 21 is not limited thereto, and a stacked film described below may be formed as the first insulating film.

FIGS. 29 to 34 are cross-sectional views illustrating steps of a method for manufacturing a semiconductor device according to the second embodiment. The same reference numerals are used for the same components as those described in the first embodiment, and the description thereof will be omitted.

Figure 29:
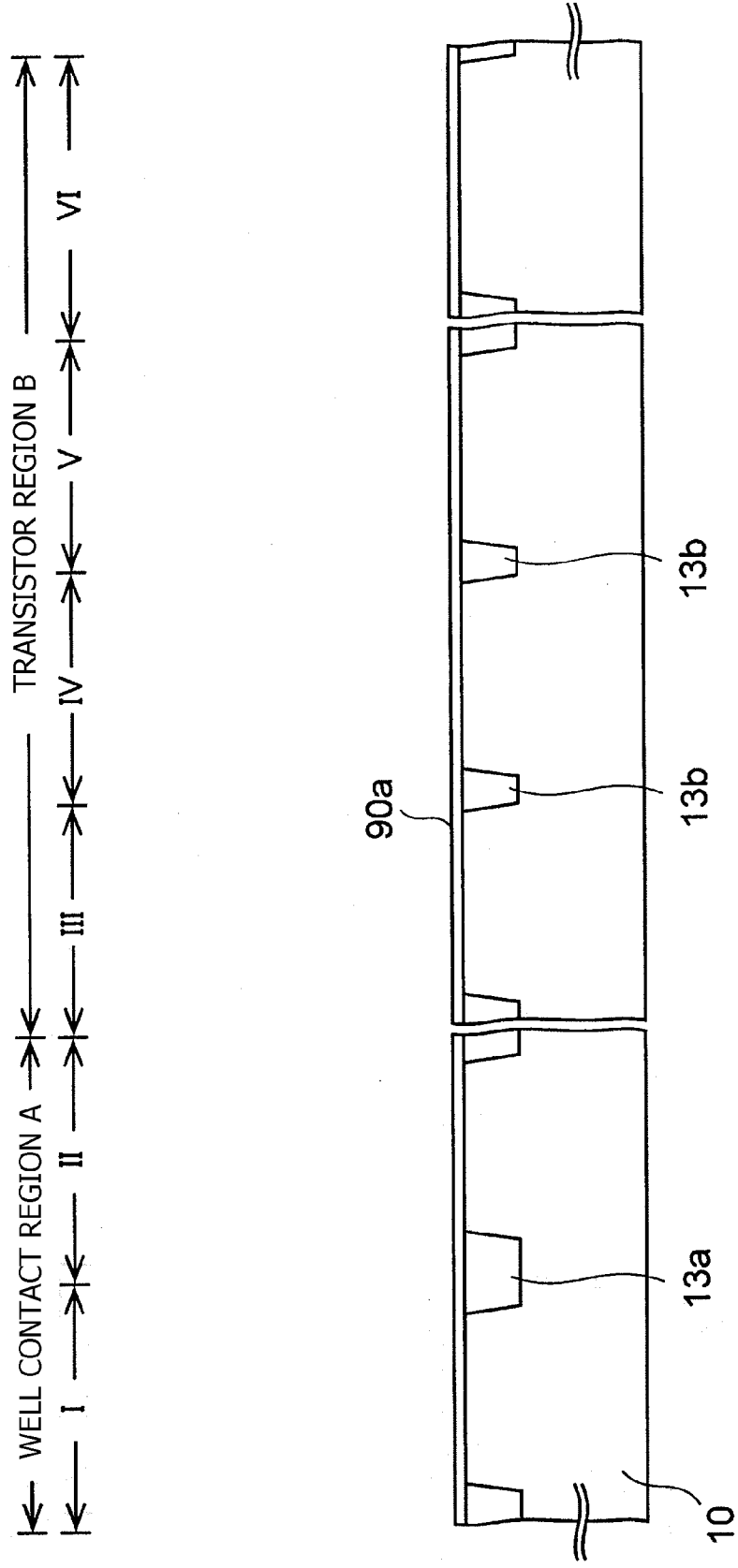
FIGS. 29 to 34 are cross-sectional views illustrating a method for manufacturing a semiconductor device according to a second embodiment.

In order to manufacture the semiconductor device according to this embodiment, after carrying out the steps described with reference to FIGS. 2 to 6 in the first embodiment, as illustrated in FIG. 29, a thermal oxide film with a thickness of about 10 nm is formed on the silicon substrate 10 as a lower layer 90a of a first insulating film 90, which will be described below.

Figure 30:
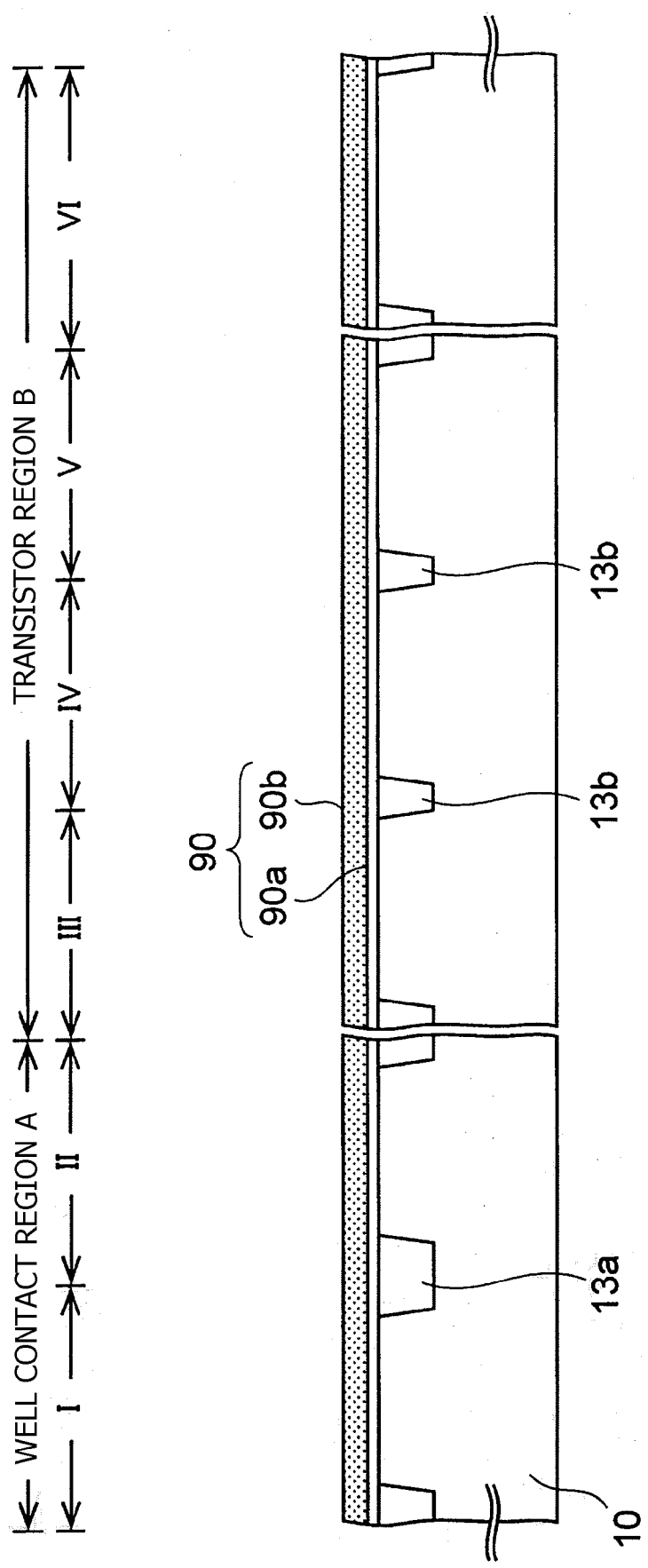

As illustrated in FIG. 30, by applying a photoresist by spin-coating on the lower layer 90a, a photoresist layer is formed as an upper layer 90b of the first insulating film 90 with a thickness of 120 to 360 nm, for example, 210 nm.

The conditions for forming the upper layer 90b are not particularly limited. In this embodiment, after a photoresist coating film is formed on the lower layer 90a, the coating film is heated to a first temperature that is higher than the temperature at which the photoresist is crosslinked, e.g., at about 350° C., thereby forming the upper layer 90b which is composed of the sufficiently crosslinked photoresist.

Figure 31:
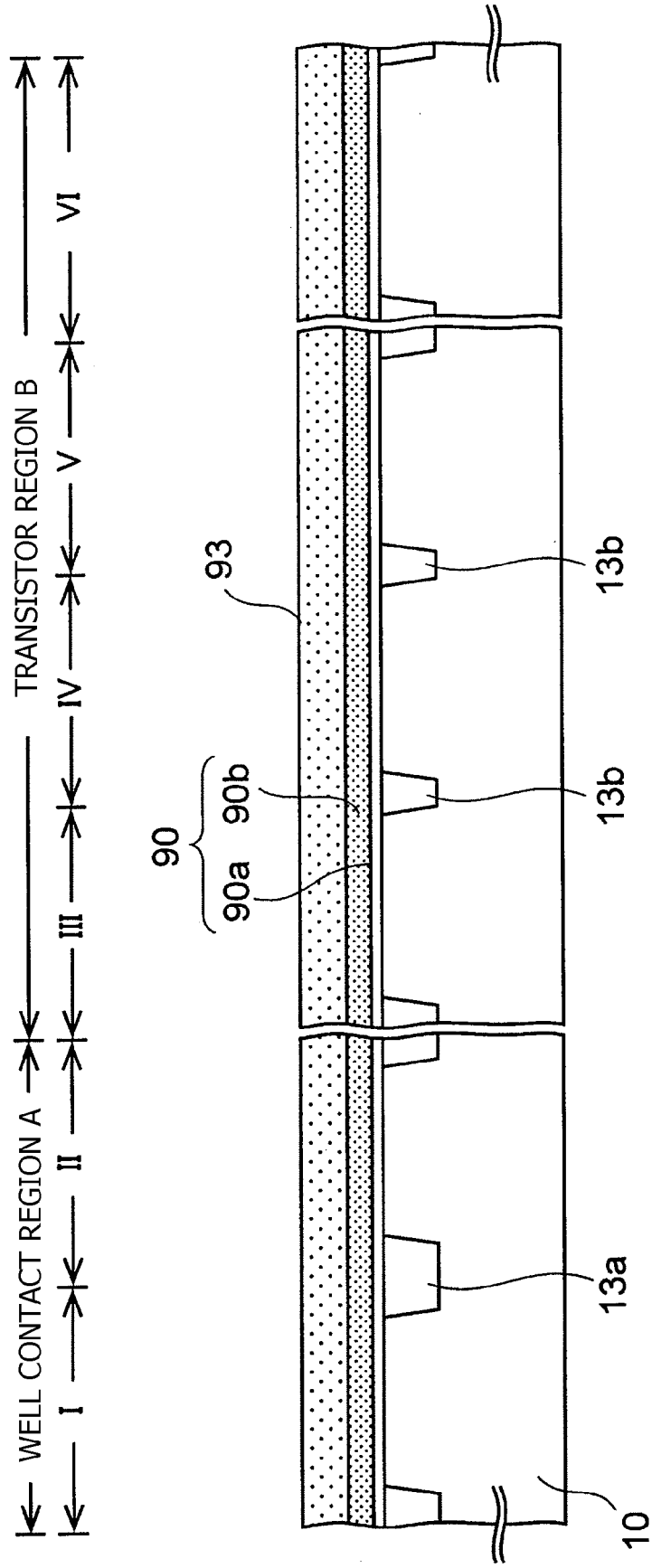

As illustrated in FIG. 31, a photoresist is applied onto the first insulating film 90 to form a coating film 93 of the photoresist. Then, the coating film 93 is heated to a second temperature that is lower than the temperature at which the photoresist in the coating film 93 is crosslinked, for example, at about 90° C. The heating is performed for the purpose of evaporating off the solvent component in the coating film 93 by baking.

Since the upper layer 90b is fully crosslinked before the coating film 93 is formed, it is possible to prevent mixing in which the coating film 93 and the upper layer 90b are melted together.

Figure 32:
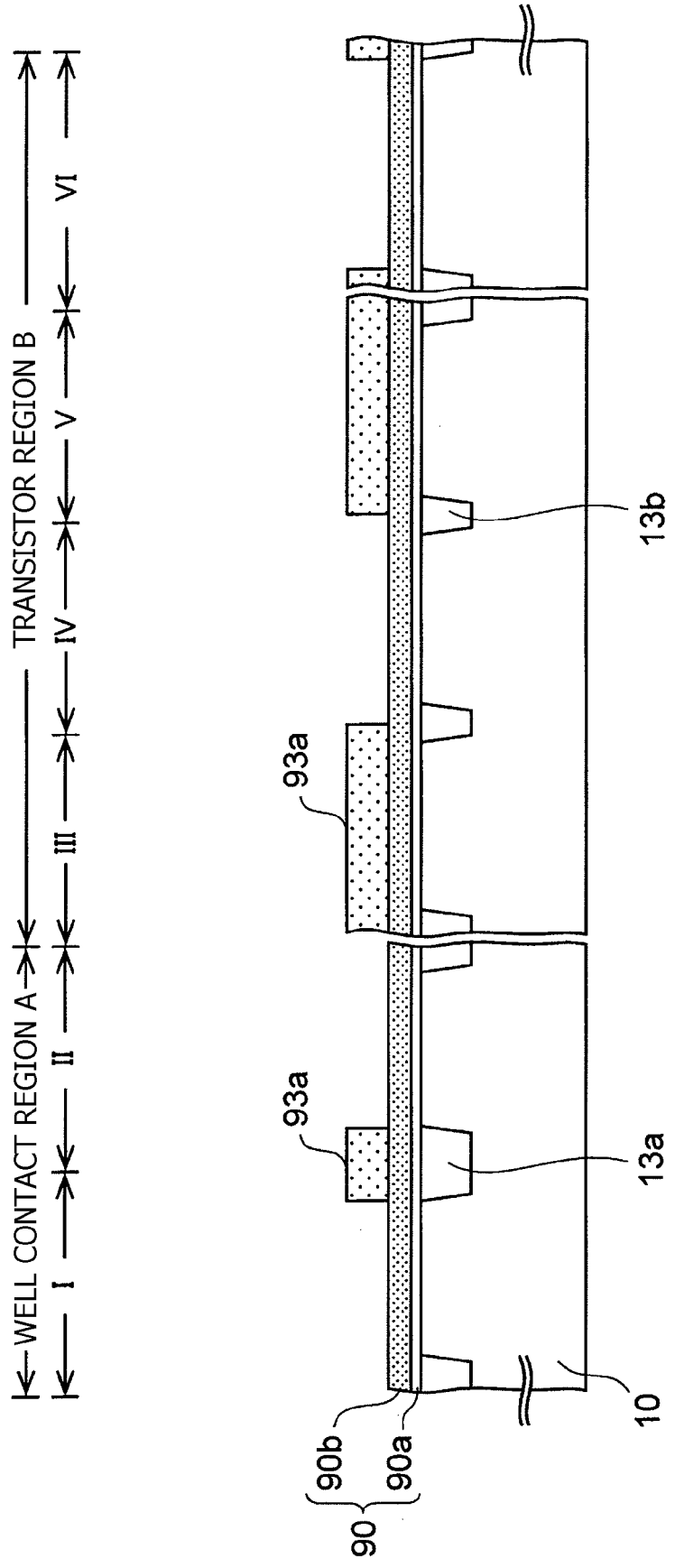

As illustrated in FIG. 32, by subjecting the photoresist coating film 93 to exposure and development, a second resist pattern 93a is formed on the first insulating film 90.

The fully crosslinked upper layer 90b is not removed by development and remains on the entire surface of the lower layer 90a.

Figure 33:
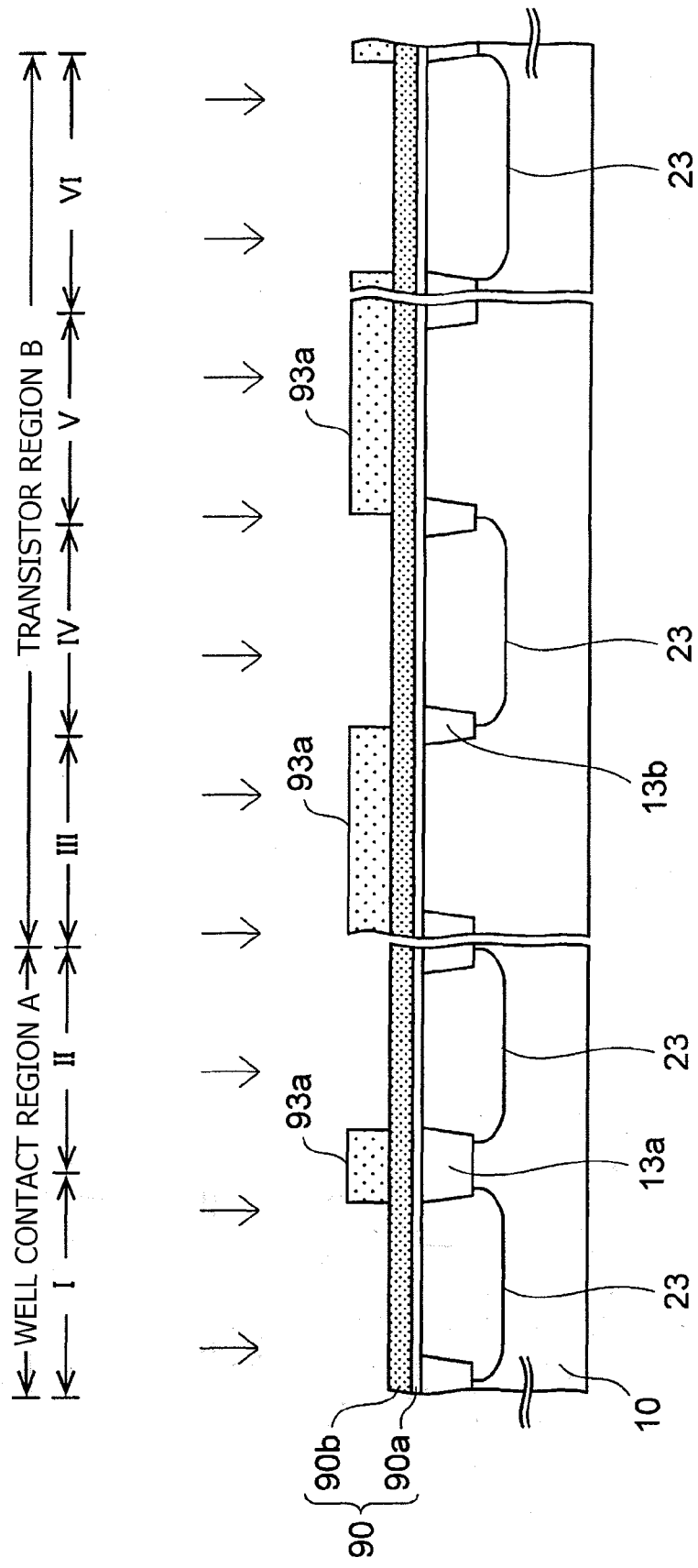

As illustrated in FIG. 33, using the first resist pattern 93a as a mask and using the first insulating film 90 as a through film, an n-type impurity is ion-implanted into the silicon substrate 10 to form first n-wells 23 in the silicon substrate 10. The n-type impurity is, for example, phosphorus.

In the ion implantation, directivity of the n-type impurity may be sufficiently disturbed by the first insulating film the thickness of which is increased by the stacked structure of the lower layer 90a and the upper layer 90b. Therefore, channeling of the n-type impurity may be prevented, and first n-type wells 23 may be formed in shallow portions of the substrate 10.

The conditions for the ion implantation are not particularly limited. For example, the acceleration energy is set at 360±30 keV, the dose is set at $3\times10^{13}$ cm$^{-2}$±10%, and the tilt angle is set at 0°.

In this embodiment, the ion implantation is performed at an acceleration energy of 360 keV, a dose of $3\times10^{13}$ cm$^{-2}$, and a tilt angle of 0°.

After the ion implantation, the upper layer 90b and the first resist pattern 93a are removed by ashing using oxygen plasma. The upper layer 90b and the lower layer 90a have different etching characteristics, and the lower layer 90a has a lower etching rate during ashing. Therefore, the lower layer 90a remains on the silicon substrate 10 after the ashing.

Figure 34:
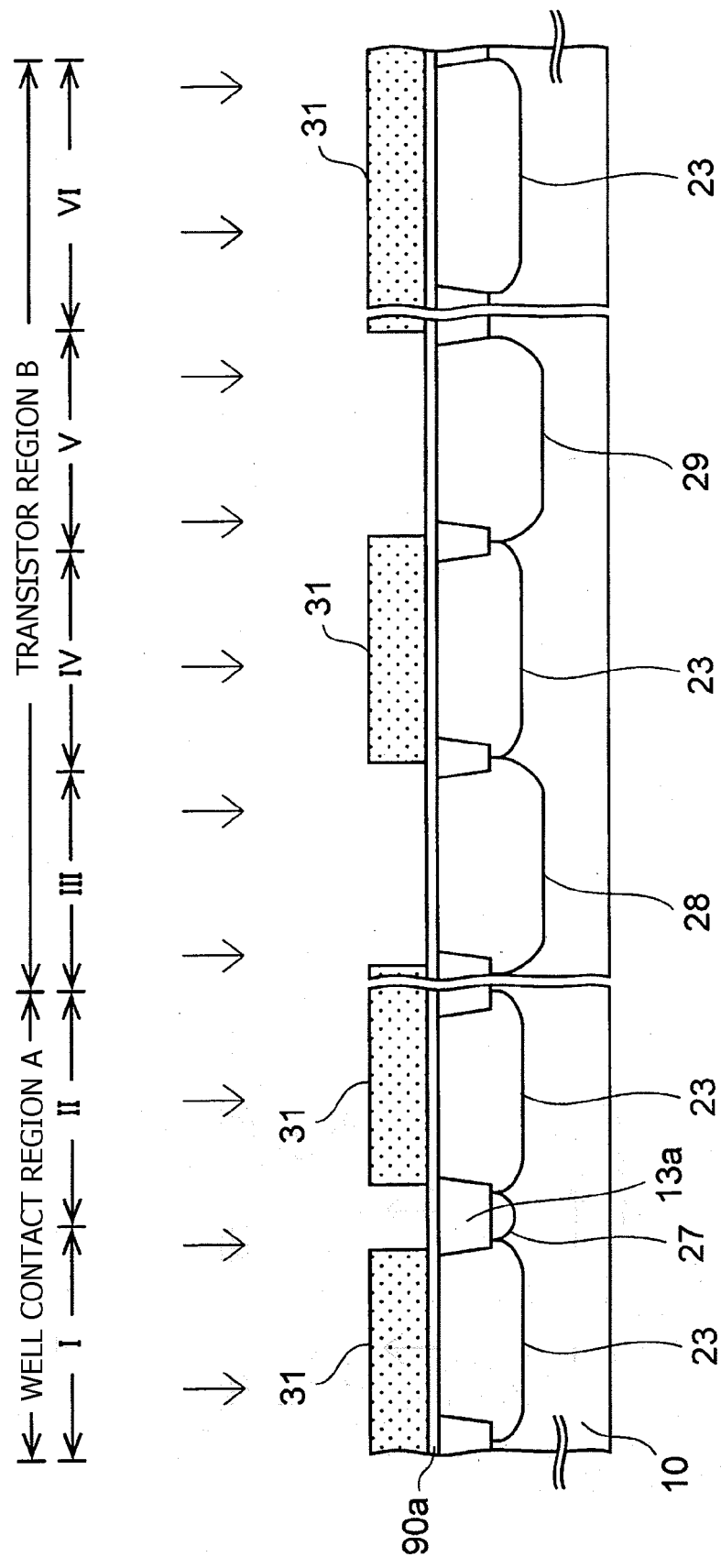

As illustrated in FIG. 34, a photoresist is applied onto the remaining lower layer 90a, and by exposing and developing the photoresist, a second resist pattern 31 is formed.

Using the second resist pattern 31 as a mask, boron is implanted as a p-type impurity into the silicon substrate 10 to form a first p-well 27, a second p-well 28, and a third p-well 29 in the silicon substrate 10.

During the ion implantation, in the first insulating film 90, the lower layer 90a which remains without being subjected to ashing serves as a through film. Thus, the first p-well 27, the second p-well 28, and the third p-well 29 may be formed using the through film the thickness of which is smaller than that of the through film used for forming the first n-wells 23.

In this embodiment, after the first n-wells 23 are formed, a step of forming a through film for the p-wells 27 to 29 is not required. Thus, compared with the first embodiment in which the second insulating film 30 is formed as a through film for the p-wells 27 to 29 as illustrated in FIG. 8, the manufacturing process may be simplified.

The conditions for the ion implantation in the formation of the second p-well 29 are not particularly limited. For example, the acceleration energy is set at 150±30 keV, the dose is set at $3\times10^{13}$ cm$^{-2}$±10%, and the tilt angle is set at 0°.

In this embodiment, the ion implantation is performed at an acceleration energy of 150 keV and a dose of $3\times10^{13}$ cm$^{-2}$.

Subsequently, the steps described with reference to FIGS. 9 to 17 in the first embodiment are carried out.

According to the embodiment described above, as illustrated in FIG. 33, the first insulating film 90 which serves as a through film for the first n-wells 23 is formed so as to include a two-layer structure including the lower layer 90a and the upper layer 90b which have different etching characteristics.

After the first n-wells 23 are formed, as illustrated in FIG. 34, the upper layer 90b is removed while leaving the lower layer 90a only using the difference in the etching characteristics, and using the remaining lower layer 90a as a through film, the first p-well 27, the second p-well 28, and the third p-well 29 are formed.

Channeling during the formation of the first n-wells 23 may be prevented by the thick first insulating film having the two-layer structure including the lower layer 90a and the upper layer 90b, and it is not necessary to newly form a through film for forming the p-wells 27 to 29, thus simplifying the manufacturing process.

Although the embodiments have been described in detail above, the present invention is not limited to the embodiments described above. For example, in the first embodiment, after the first n-wells 23 are formed, the first p-well 27, the second p-well 28, and the third p-well 29 are formed. However, the order of formation may be reversed so that the first p-well 27, the second p-well 28, and the third p-well 29 are formed first, and then the first n-wells 23 are formed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A method of manufacturing a semiconductor device comprising:
    forming a first isolation insulating film in a semiconductor substrate to define a first region and a second region;
    forming a second isolation insulating film in the semiconductor substrate to define a third region and a fourth region;
    forming a first insulating film with a first thickness over the first region, the second region, the third region, the fourth region, the first isolation insulating film, and the second isolation insulating film;
    implanting a first impurity of a first conductivity type, through the first insulating film, into the first region, the second region, and the fourth region at a first depth in the semiconductor substrate;
    forming a second insulating film with a second thickness thinner than the first thickness over the first region, the second region, the third region, the fourth region, the first isolation insulating film, and the second isolation insulating film;
    implanting a second impurity of a second conductivity type, through the second insulating film, into the third region at a second depth in the semiconductor substrate;
    implanting a third impurity of the second conductivity type into the third region at a third depth shallower than the second depth;
    forming a first transistor including first source/drain regions of the first conductivity type in the third region; and
    forming a second transistor including second source/drain regions of the second conductivity type in the fourth region.

2. The method according to claim 1, wherein the first insulating film and the second insulating film are each a silicon oxide film.

3. The method according to claim 1, wherein the first insulating film is formed on the second insulating film;
    after the first impurity is implanted, the first insulating film is removed while leaving the second insulating film;
    after the first insulating film is removed, the second impurity is implanted.

4. The method according to claim 3, wherein the second insulating film is a silicon oxide film, and the first insulating film is a photoresist layer.

5. The method according to claim 4, wherein the first impurity is implanted using, as a mask, a resist pattern formed over the photoresist layer.

6. The method according to claim 5, wherein the photoresist is formed by forming a first coating film over the second insulating film, and then heating the first coating film at a first temperature higher than a temperature at which the first coating film is crosslinked; and the resist pattern is formed by forming a second coating film over the photoresist layer, then heating the second coating film at a second temperature which is lower than a temperature at which the second coating film is crosslinked, and exposing and developing the second coating film.

7. The method according to claim 1, wherein the second depth is deeper than the first depth.

8. The method according to claim 1, wherein the second impurity is implanted using, as a mask, a mask layer including windows on the third region and the first isolation insulating film.

9. The method according to claim 1, wherein the third impurity is implanted through the second insulating film.

10. The method according to claim 1, wherein the concentration peak of the second impurity is located at a position deeper than a bottom of the second isolation insulating film, and the concentration peak of the third impurity is located at a position shallower than the bottom of the second isolation insulating film.

11. The method according to claim 1, wherein the first region and the fourth region are electrically coupled to each other by the first impurity.

12. The method according to claim 1, further comprising:
implanting a fourth impurity of the first conductivity type into a fifth region at a fourth depth deeper than both the first depth and the second depth; and
forming a third transistor including third source/drain regions of the first conductivity type in the fifth region,
wherein, in implanting of the second impurity, the second impurity is also implanted into the fifth region.

13. The method according to claim 1, further comprising:
forming a fourth transistor including fourth source/drain regions of the second conductivity type and including a second gate length larger than a first gate length of the second transistor in a sixth region of the semiconductor substrate,
wherein in implanting of the first impurity, the first impurity is also implanted into the sixth region, and the second region and the sixth region is electrically coupled to each other by the first impurity.

14. The method according to claim 1, wherein the first conductivity type is an n-type, and the second conductivity type is a p-type.

* * * * *